(12) United States Patent
Mardi et al.

(10) Patent No.: US 10,539,610 B2
(45) Date of Patent: *Jan. 21, 2020

(54) CHIP PACKAGE TEST SYSTEM

(71) Applicant: Xilinx, Inc., San Jose, CA (US)

(72) Inventors: Mohsen H. Mardi, Saratoga, CA (US); David M. Mahoney, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 107 days.

This patent is subject to a terminal disclaimer.

(21) Appl. No.: 15/802,253

(22) Filed: Nov. 2, 2017

(65) Prior Publication Data
US 2019/0128956 A1 May 2, 2019

(51) Int. Cl.
*G01R 31/00* (2006.01)
*G01R 31/28* (2006.01)
*G01R 31/04* (2006.01)

(52) U.S. Cl.
CPC ....... *G01R 31/2891* (2013.01); *G01R 31/045* (2013.01); *G01R 31/2853* (2013.01)

(58) Field of Classification Search
CPC .. G01R 1/0433; G01R 1/0466; G01R 1/0458; G01R 1/0483; G01R 31/2886; G01R 31/2863; G01R 31/2867; G01R 31/2891; G01R 1/0441; G01R 1/073; G01R 31/2817; G01R 31/2893; G01R 35/00; G01R 1/0408; G01R 1/07314; G01R 31/27; G01R 31/2874; G01R 31/2875; G01R 35/005; H01R 2201/20; H01R 12/88; H01R 13/24; H01R 12/714; H01R 13/629; H01R 13/62905; H01R 13/62972; H01R 13/701

See application file for complete search history.

(56) References Cited

U.S. PATENT DOCUMENTS

| | | | | |
|---|---|---|---|---|
| 5,493,237 A * | 2/1996 | Volz | ..................... | G01R 1/0483 324/756.05 |
| 5,640,303 A * | 6/1997 | Hooley | ................ | H05K 7/1061 165/46 |
| 6,369,595 B1* | 4/2002 | Farnworth | ........... | G01R 1/0483 324/756.02 |
| 6,447,322 B1* | 9/2002 | Yan | ...................... | G01R 1/0458 361/709 |
| 7,567,075 B2* | 7/2009 | Kostuchowski | .......... | E05C 3/14 324/750.25 |
| 2004/0223309 A1* | 11/2004 | Haemer | ............. | G01R 1/07314 361/767 |

* cited by examiner

*Primary Examiner* — Vinh P Nguyen
(74) *Attorney, Agent, or Firm* — Keith Taboada

(57) ABSTRACT

An integrated chip package assembly test system and method for testing a chip package assembly are described herein. In one example, an integrated circuit chip package test system includes a socket and a workpress. The socket is configured to receive a chip package assembly for testing in the test system. The workpress is positioned over the socket and has a bottom surface that is dynamically conformable to a multi-planar top surface topography of the chip package assembly.

19 Claims, 15 Drawing Sheets

CHIP PACKAGE TEST SYSTEM

TECHNICAL FIELD

Embodiments of the present invention generally relate to an automated test system having a workpress configured to conform to a top surface of a device under test.

BACKGROUND

Electronic devices, such as tablets, computers, copiers, digital cameras, smart phones, control systems and automated teller machines, among others, often employ electronic components which leverage integrated circuit (e.g., chip) package assemblies for increased functionality and higher component density. Chip package assemblies include one or more integrated circuit dice mounted on a package substrate.

Prior to incorporation into an electronic device, chip packages are tested to ensure that the performance of the chip packages meet predefined performance criteria. In most conventional automatic test equipment utilized to test chip packages, some type of clamp or actuator is utilized to force the chip package into a test socket that electrically couples the circuitry of the chip package with test circuitry of the automatic test equipment. The actuator of the automatic test equipment is typically coupled to a first end of a workpress. The workpress may be any interface utilized to push or drive a device under test (DUT) or other workpiece against the test socket or other supporting surface A second end of the workpress has a surface specifically designed to engage the top surface of the chip package while pressing the chip package into the test socket. The actuator is configured to move the workpress to apply a force to the top of the chip package, thus urging the chip package into the test socket. Because second surface of the workpress contacting the chip package is typically machined out of aluminum, workpress may not apply force as designed to the chip package due to height differences within the chip package, such as for example differences in height between stiffeners, lids, package substrates and the like. The nonuniform application of force results in some regions of the chip package receiving too much force while other regions not receiving enough force to ensure good electrical connection between the chip package and test socket. Undesirably, this may lead to damage and poor testing of the chip package. The challenges of applying force as intended increases dramatically in lid-less chip package designs where differences in the heights of tightly spaced dice may vary significantly.

Therefore, a need exists for an improved test system and method for testing integrated circuit packages.

SUMMARY

An integrated chip package assembly test system and method for testing a chip package assembly are described herein. In one example, an integrated circuit chip package test system includes a socket and a workpress. The socket is configured to receive a chip package assembly for testing in the test system. The workpress is positioned over the socket and has a bottom surface that is dynamically conformable to a multi-planar top surface topography of the chip package assembly.

In another example, a method for testing a chip package is provided. The method includes moving a bottom surface of a workpress against a multi-planar top surface topography of a chip package assembly disposed in a socket of an automated test system; dynamically conforming the bottom surface of the workpress to the multi-planar top surface topography of the chip package assembly as the workpress moves towards the socket; and testing the chip package utilizing signals transmitted through the socket to the chip package assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The scale of the figures, including the relative scale of items depicted within a single figure, are not to scale for the purpose of clarity of explanation due to the small size and tight spacing of the actual components.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly test system and method for testing chip package assemblies disclosed herein that advantageously reduce the potential of damage to devices under test (DUT). The chip package assembly test system incorporates a workpress having a bottom surface that dynamically conformed to the topography of the DUT. The workpress may be any interface utilized to push or drive the DUT or other workpiece against a supporting surface, such as a test socket of the test system. The dynamically conforming workpress additionally contact the DUT with a plurality of individual separate and distinct pusher pins that can be configured to apply a localized force to selected portions of the DUT. Moreover, since the force can be distributed across the DUT as needed to ensure robust electrical connection between the DUT and test system, the locally applied force may be much smaller as compared with the force applied utilizing conventional systems, thereby significantly reducing the potential damage to the DUT. It is also contemplated that the workpiece supporting surface may also be configured with a dynamically conforming surface that supports the DUT with a plurality of individual separate and distinct pusher pins that can be configured to apply a localized force to selected portions of the DUT. It is further contemplated that the DUT may be a wafer when performing wafer level testing, or other object to be tested that would benefit from being secured in a test system utilizing dynamically conforming DUT contacting and/or supporting surfaces. These and other advantages are described below.

Figure 1:
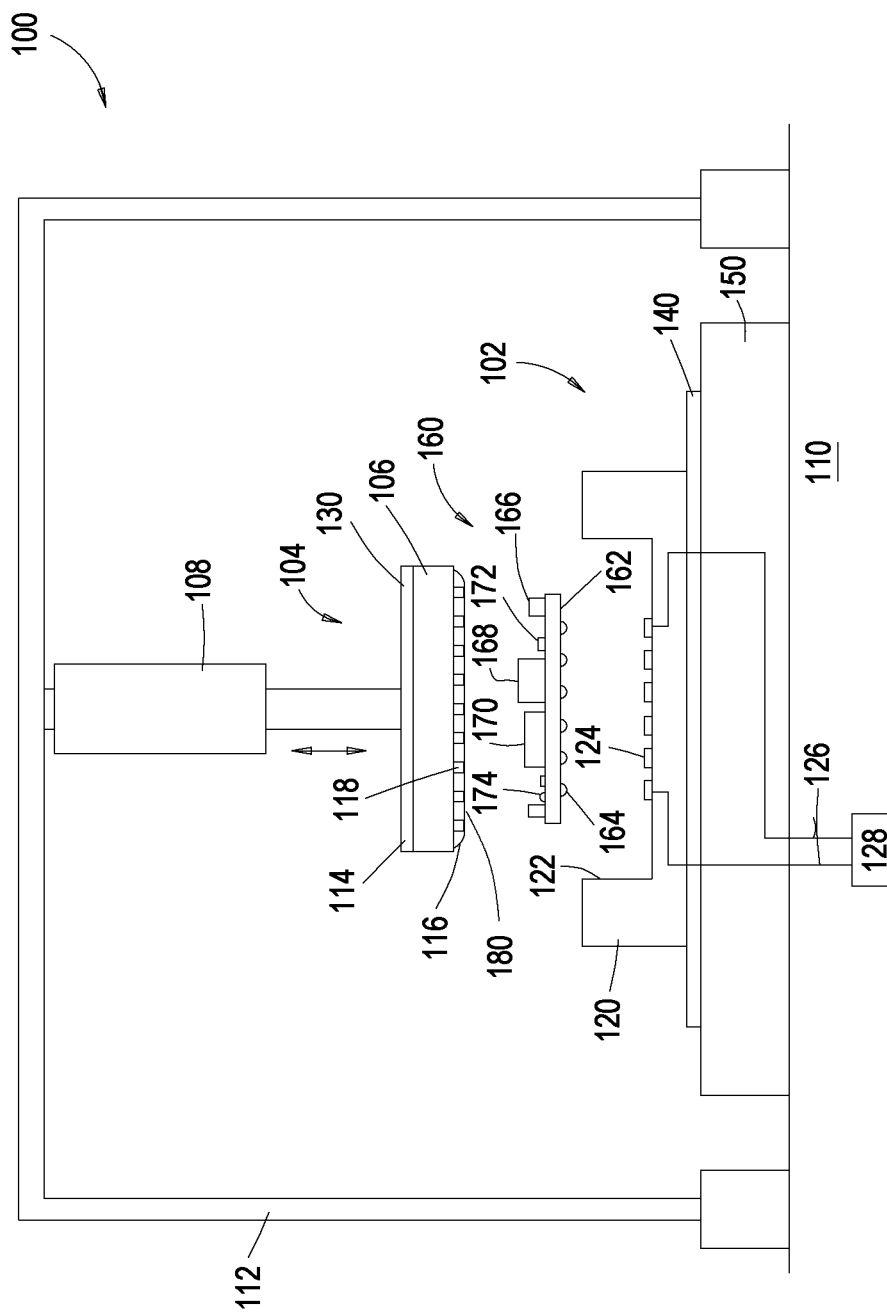
FIG. 1 is a schematic side view of a chip package assembly test system having a workpress that dynamically conforms to a top surface of a device under test.

FIG. 1 is a schematic side view of a chip package assembly test system 100 having a workpress 106 that dynamically conforms to a top surface of a DUT. The DUT is generally described herein as a chip package assembly 160, although the workpress 106 and or test system 100 may be adapted for use with other workpieces. Prior to describing the test system 100 in greater detail, an exemplary chip package assembly 160 will be described below. However, the specific configuration of the chip package assembly 160 described below is just for purposes of illustration, and other variations of chip package assemblies may be tested utilizing the test system 100 described herein.

The chip package assembly 160, ball grid array (BGA) packages as a non-limiting example, generally includes at least one or more integrated circuit (IC) dice disposed on a package substrate 162. In the example depicted in FIG. 1, two dice 168, 170 are shown with the die 168 extending higher above the package substrate 162 relative to the die 170. In some embodiments, an interposer (not shown) may be utilized to provide improved interconnection between the IC dice 168, 170, and the package substrate 162. The IC dice 168, 170 may be a programmable logic device, such as field programmable gate arrays (FPGA), a memory device, an optical device, a MEMS device, a processor or other IC logic or memory structure. Optical devices include photo-detectors, lasers, optical sources, and the like. Solder bumps 164 are disposed on a bottom surface of the package substrate 162 to facility electrical communication of power, ground and signals to the circuitry of the dice 168, 170 mounted to the package substrate 162. The functionality of the dice 168, 170 are provided by solid state circuitry formed in the dice 168, 170. At the end of the chip package assembly fabrication process, the chip package assemblies 160 are tested to ensure robust and predictable performance.

The chip package assembly 160 may also include one or more of the following components: a stiffener 166, one or more surface mounted circuit elements 172, and one or more test pads 174. The stiffener 166 is fabricated from a rigid material and is attached to the package substrate 162 near the perimeter of the package substrate 162. The stiffener 166 circumscribes the dice 168, 170 and functions to minimize warpage of the package substrate 162.

The surface mounted circuit elements 172 are mounted to the package substrate 162. The surface mounted circuit elements 172 may be a passive circuit component, such as resistors, capacitors, diodes, inductors and the like. The surface mounted circuit elements 172 are electrically connected to circuitry routed within or on the package substrate 162

The test pads 174 are mounted to the package substrate 162. The test pads 174 are utilized to provide ground, power or signals to one or more of the dice 168, 170 during testing of the chip package assembly 160. Advantageously, the test pads 174 may be utilized to communicate with one or more of the dice 168, 170 during testing without having to utilize a dedicated contact pad of the test system 100 interfaced with one of the solder bumps 164 formed on the bottom of the package substrate 162.

Although not shown, the chip package assembly 160 may optionally include one or more of a cover mounted to the stiffener, heat sinks, and overmolding. As stated above, the configuration of the chip package assembly 160 shown in FIG. 1 is for illustration, and chip package assemblies having different configurations may also be tested utilizing the test system 100.

Turning now to the chip package assembly test system 100, the test system 100 includes at least one test station 102, a workpress assembly 104, a base 110 and a test controller 128. The test station 102 and the workpress assembly 104 are coupled to the base 110.

The test station 102 includes a mother board 150 that is mounted to the base 110. A daughter board 140 is coupled to the mother board 150. The daughter board 140 has one or more test sockets 120. Only a single test socket 120 is illustrated in FIG. 1 for simplicity. The test socket 120 generally includes a recess 122 configured to receive the chip package assembly 160 to be tested by the test system 100. The recess 122 includes exposed contact pads 124 that are coupled by routing 126 running through the mother and daughter boards 150, 140 to the controller 128 to facilitate electric communication between the controller 128 and the chip package assembly 160 during testing.

The workpress assembly 104 is supported by a support 112 above the test station 102. The support 112 is coupled to the base 110. The support 112 may be a stanchion or gentry, and supports the workpress assembly 104 over the test station 102. The workpress assembly 104 is configured to urge and engage the chip package assembly 160 with the socket 120 of test station 102 for testing as further described below.

The workpress assembly 104 includes a workpress 106, a mounting plate 130 and an actuator 108. The workpress 106 has a bottom surface 116 facing the socket 120 and a top surface. The top surface of the workpress 106 is coupled by the mounting plate 130 to the actuator 108. The actuator 108 couples the mounting plate 130 to the support 112. The actuator 108 is operable to move the workpress 106 towards and away from the socket 120. In one example, the actuator 108 is coupled to the test controller 128 and automatically moves the workpress 106 in response to instructions from the test controller 128. The actuator 108 is configured to push the chip package assembly 160 disposed against a bottom (shown by a dashed line 180) of the workpress 106 into the socket 120 with sufficient force to ensure robust electrical contact between the solder bumps 164 of chip package assembly 160 and contact pads 124 formed in the recess 122 of the socket 120 to facilitate effective communication of power, ground and signals that facilitate testing of the chip package assembly 160. The actuator 108, such as a pneumatic cylinder, ball screw, or other linear actuator, that can control the force exerted by the workpress 106 that pushes the chip package assembly 160 against the socket 120. In one example, the actuator 108 is operable to urge the workpress 106 downward against the chip package assembly 160 with a force of about 35 grams per solder bump 164.

As discussed above, the contact pads 124 of the test station 102 are coupled to the test controller 128. The test controller 128 generally executes test routine (e.g., predetermined test routine) that is stored in or accessible by the test controller 128. The test routine may be inputted into the test controller 128 through a user interface, or uploaded or accessed from the test controller 128 and/or host processing system (not shown). The test controller 128 executes the test routine in a manner that runs a predefined test on the chip package assembly 160 disposed in the socket 120 of the test station 102. The test routine may be one or more of a DC test routine, a burn-in routine, post burn-in routine, a final test routine or other predefined test routine to be performed on the chip package assembly 160.

In one example, a DC test routine is performed on chip package assembly 160 disposed in the socket 120 of the test station 102. The DC test routine may include subjecting the chip package assembly 160 to a high DC load for a period to time, and testing the chip package assembly 160 for electrical shorting, resistance, temperature rise, RC delay, speed, other performance characteristic or malfunction or other defect.

In another example, a burn-in test routine is performed on chip package assembly 160 disposed in the socket 120 of the test station 102. The burn-in test routine may include subjecting the chip package assembly 160 to a high-stress environment, such as high voltage, high amperage, high temperature and/or high frequency electric signals. The burn-in test routine may include subjecting the chip package assembly 160 to a high-stress environment for a period to time, and testing the chip package assembly 160 for a short, resistance, temperature rise, RC delay, speed, other performance characteristic or malfunction or other defect.

In yet another example, a post burn-in test routine is performed on chip package assembly 160 disposed in the test station 102. The post burn-in test routine may include testing the electrical characteristics and function of the chip package assembly 160 at room temperature and below room temperature. The post burn-in test routine may include subjecting the chip package assembly 160 to a room temperature environment for a period to time, and testing the electrical characteristics and function of the chip package assembly 160. The post burn-in test routine may also include subjecting the chip package assembly 160 to a sub-room temperature environment for a period to time, and testing the electrical characteristics and function of the chip package assembly 160. The post burn-in test routine may include determining test information, such as performance, functionality, pass, fail or other performance information associated with the tested chip package assembly 160. Other performance may include, but is not limited to, one or more of resistance, temperature rise, RC delay, speed, malfunction or other defect In still yet another example, a final test routine is performed on chip package assembly 160 disposed in the test station 102. The final test routine may include testing the electrical characteristics and function of the chip package assembly 160 at a temperature elevated above room temperature (e.g., elevated temperature such as at about 155 degrees Celsius) and/or at a temperature below room temperature (e.g., cold temperature such as at about −55 degrees Celsius). The final test routine may include subjecting the chip package assembly 160 to an elevated (and/or cold) temperature environment for a period to time, and testing the electrical characteristics and function of the chip package assembly 160. The final test routine may include determining test information, such as performance, functionality, pass, fail or other performance information, to the information stored on the test controller 128 and uniquely associated with the tested chip package assembly 160.

In yet another example, the final test routine performed on chip package assembly 160 may mimic operating conditions of the device in which the chip package assembly 160 will be interfaced with. The operating conditions of the final test routine may include temperature variation and voltage fluctuations. It is contemplated that other test routines may be performed in the test station 102 or other test station within the test system 100.

Since chip package assemblies 160 having different designs often have different patterns for solder bumps 164 formed on the bottom surface of the package substrate 162 that do not match the pattern of contact pads 124 disposed in the bottom of the socket 120, the daughter board 140 may be easily replaced with another daughter board 140 having a replacement socket 120 that is configured to mate with the next chip package assembly 160 to be tested in the test system 100.

As discussed briefly above, the bottom 180 of the workpress 106 is configured to dynamically conform to a top surface of the chip package assembly 160. In one example to achieve this result, the bottom 180 of the workpress 106 includes a plurality of projecting pusher pins 118. The pusher pins 118 function as a "bed of nails" which apply force to plurality of individually separate and distinct locations of the chip package assembly 160. In this manner, the localized force may be much less than a force spread across the entire chip package assembly 160 as done in conventional test systems. The local reduction in force advantageously reduces the potential of damage to the chip package assembly 160. In one example, each pusher pin 118 is operable to urge the chip package assembly 160 into the socket 120 with a force of about a force of between about 0.15 to 1.00 newtons (N) at about half the stroke of the pusher pin 118. Moreover, the locations of each pusher pin 118, along with the force generated by each pusher pin 118 when contacting the chip package assembly 160, may be selected so as to not damage the components of the chip package assembly 160. Additionally, the pusher pins 118 are advantageously non-conductive between the ends of the pusher pins 118 such that the pusher pins 118 do not inadvertently short components of the chip package assembly 160 while under test.

Figure 2:
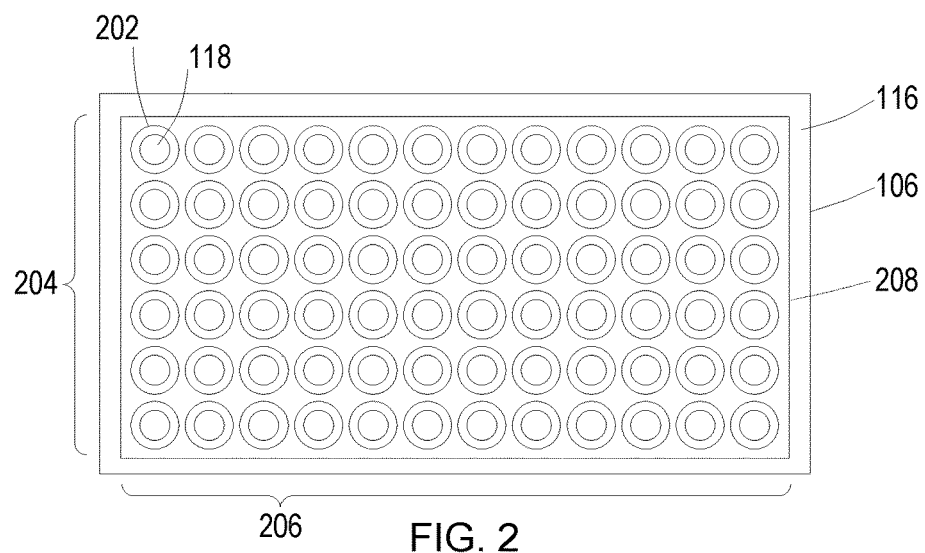
FIGS. 2-6 are bottom views of a workpress of the chip package assembly test system of FIG. 1 having various distributions of pusher pins, according to various embodiments.

FIGS. 2-6 are bottom views of the workpress 106 of the chip package assembly test system 100 of FIG. 1 having various distributions of pusher pins 118, according to different embodiments. Referring first to FIG. 2, the pusher pins 118 are illustrated extending through a plurality of pusher pin holes 202 formed through the bottom surface 116 of the workpress 106. Each pusher pin 118 resides in a corresponding one of the holes 202. The holes 202 may be arranged in an array, have a non-regular pattern, a grid pattern or other pattern suitable for advantageously distributing force to the top surface of the chip package assembly 160.

In the example depicted in FIG. 2, the holes 202 are arranged in N rows 204 and M columns 206, where N and M are positive integers. The 6 rows 204 and 12 columns 206 of holes 202 are merely for illustrative purposes, and any number N, M of holes 202 comprising the rows 204 and columns 206 may be chosen in response to the topography of the chip package assembly 160 to be tested and the force desired to be distributed across that topography.

In the example depicted in FIG. 2, the rows 204 and columns 206 are arranged in a Cartesian grid, the extents of which form a boundary 208. The boundary 208 is illustrated by a dashed line. Within the boundary 208, the rows 204 and columns 206 are uniformly distributed in both the row and column directions.

Figure 3:
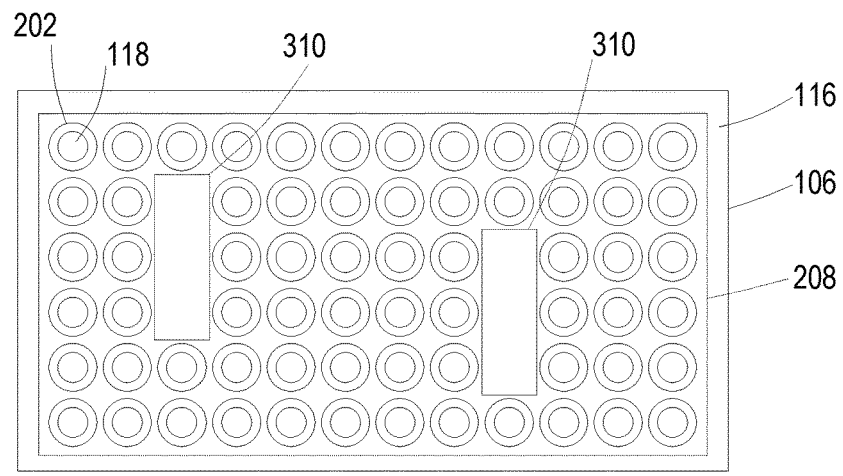

FIG. 3 depicts a bottom view of the workpress 106 of the chip package assembly test system 100 with a distribution of pusher pins 118 different than that of FIG. 2. The workpress 106 illustrated in FIG. 3 includes one or more depleted areas 310 defined within the boundary 208. The depleted area 310 defined on the bottom surface 116 of the workpress 106 is devoid of pusher pin holes 310. Stated differently, no holes 202 are formed in the bottom surface 116 of the workpress 106 within the depleted area 310. Since there are no holes 202 disposed in the depleted area 310, there are also no pusher pins 118 in the depleted area 310. Since there are no pusher pins 118 disposed in the depleted area 310, consequently no force is applied to the chip package assembly 160 below the depleted area 310. The depleted area 310 may be located over regions of the chip package assembly 160 in which it would be undesirable to contact with the pusher pin 118.

Each depleted area 310 encompasses an area that would have been utilized at least one hole 202. In the example illustrated in FIG. 3, the depleted area 310 encompasses an area that would have been utilized by three rows of holes 202 when arranged in a single column. Alternatively, the depleted area 310 may have another shape, included by not limited to a ring shape, a rectangular shape, and a single point, among others.

Figure 4:
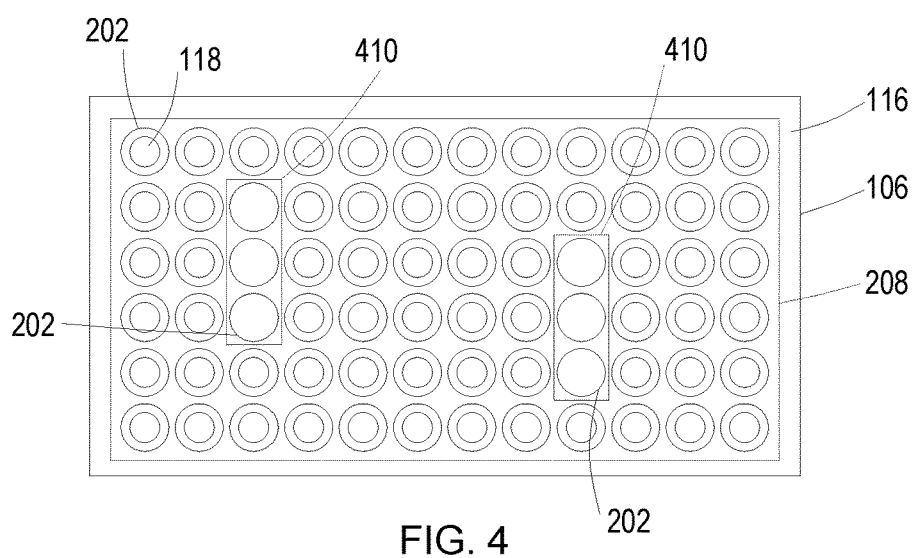

FIG. 4 depicts a bottom view of the workpress 106 of the chip package assembly test system 100 with a distribution of pusher pins 118 different than that of FIG. 2. Similar to FIG. 3, the workpress 106 illustrated in FIG. 4 includes one or more depleted areas 410 defined within the boundary 208. In the depleted area 410, there are no pusher pins 118 disposed in the holes 202 are formed in the bottom surface 116 of the workpress 106. Consequently, no force is applied to the chip package assembly 160 below the depleted area 410. The depleted area 410 may be located over regions of the chip package assembly 160 in which it would be undesirable to contact with the pusher pin 118. The depleted area 410 may be located as desired on the bottom surface 116 of the workpress 106 as described above with reference to the depleted area 310.

Figure 5:
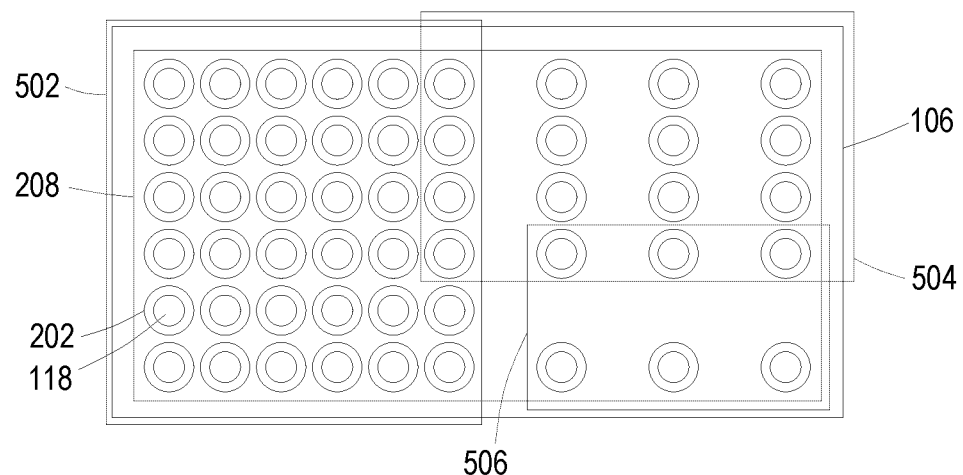

FIG. 5 depicts a bottom view of the workpress 106 of the chip package assembly test system 100 with a distribution of pusher pins 118 different than that of FIGS. 2-4. In the example illustrated in FIG. 5, the pusher pins 118 disposed within the boundary 208 are grouped in at least two regions of different pusher pin density.

For example, a first region 502 includes a first group of pusher pins 118 disposed within the boundary 208 having a common pitch that is the same in at least one direction (i.e., at least one of a row or column). In the example illustrated in FIG. 5, the first group of pusher pins 118 disposed in the first region 502 have a common pitch in both the rows and columns.

A second region 504 includes a second group of pusher pins 118 disposed within the boundary 208 that have a common pitch that is the different in one direction as compared to the first group of pins 118 disposed in the first region 502. Stated differently, the second group of pusher pins 118 disposed in the second region 504 have a pitch in common with the first group of pusher pins 118 of the first region 502 in only one of a row or a column. In the example illustrated in FIG. 5, the second group of pusher pins 118 disposed in the second region 504 have a pitch in common with the first group of pusher pins 118 of the first region 502 only in the rows of holes 202 and pusher pins 118, while the pitch defining the columns of holes 202 of the first group of pusher pins 118 in the first region 502 is different than that of the second group of pusher pins 118 disposed in the second region 504.

Also depicted in FIG. 3, a third region 506 includes a third group of pusher pins 118 disposed within the boundary 208 having a pitch that is the different in both directions as compared to the first group of pins 118 disposed in the first region 502. Stated differently, the third group of pusher pins 118 disposed in the third region 506 have a different pitch compared with the first group of pusher pins 118 of the first region 502 in both the rows and columns.

Figure 6:
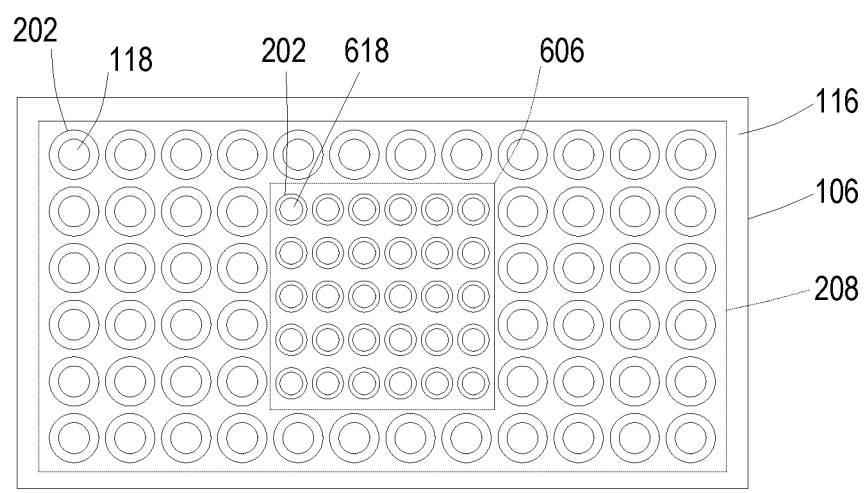

FIG. 6 depicts a bottom view of the workpress 106 of the chip package assembly test system 100 with a distribution of pusher pins different than that of FIGS. 2-5. In the example illustrated in FIG. 5, the pusher pins disposed within the boundary 208 are grouped in at least two regions of different sizes. The pusher pins comprising each of the two regions may be arranged in different densities or the same density.

For example, a region 606 includes at least one or more pusher pins 618 disposed within the boundary 208 that have a size different that is different than that of at least one or more pusher pins 118 disposed within the boundary 208. In the example illustrated in FIG. 6, the pusher pins 618 disposed in the region 606 are smaller than the pusher pins 118. The pusher pins 618 generally have the same functionality as the pusher pins 118, and may be constructed similarly as described below. Although the pusher pins 618 are grouped in a common rectangular region, the pusher pins 618 may be arranged in any manner. For example, the pusher pins 618 may be arranged in rows, rings, columns, in a grid, or as otherwise desired. In another example, one or more pusher pins 618 may be surrounded by a plurality of pusher pins 118.

It is additionally contemplated that the pusher pins 118 (and pins 618) may be arranged in two or more of the combinations described with reference to FIGS. 2-6 or other suitable manner. For example, the workpress 106 with one or more depleted areas 310 may also have one or more depleted areas 410, regions of different densities (such as two or more of the regions 502, 504 and/or 506), and regions of different size pusher pins (such as at least two regions comprising one or more pusher pins 118, 618). Similarly, the workpress 106 regions of different densities (such as two or more of the regions 502, 504 and/or 506) may also have regions of different size pusher pins (such as at least two regions comprising one or more pusher pins 118, 618). In this manner, the amount of force and location to which the force is applied to the top surface of the chip package assembly 160 may be easily configured for just about any topography of the chip package assembly 160 while robustly ensuring good electric connection with the socket 120 and with minimal risk of damage to the chip package assembly 160.

Figure 7:
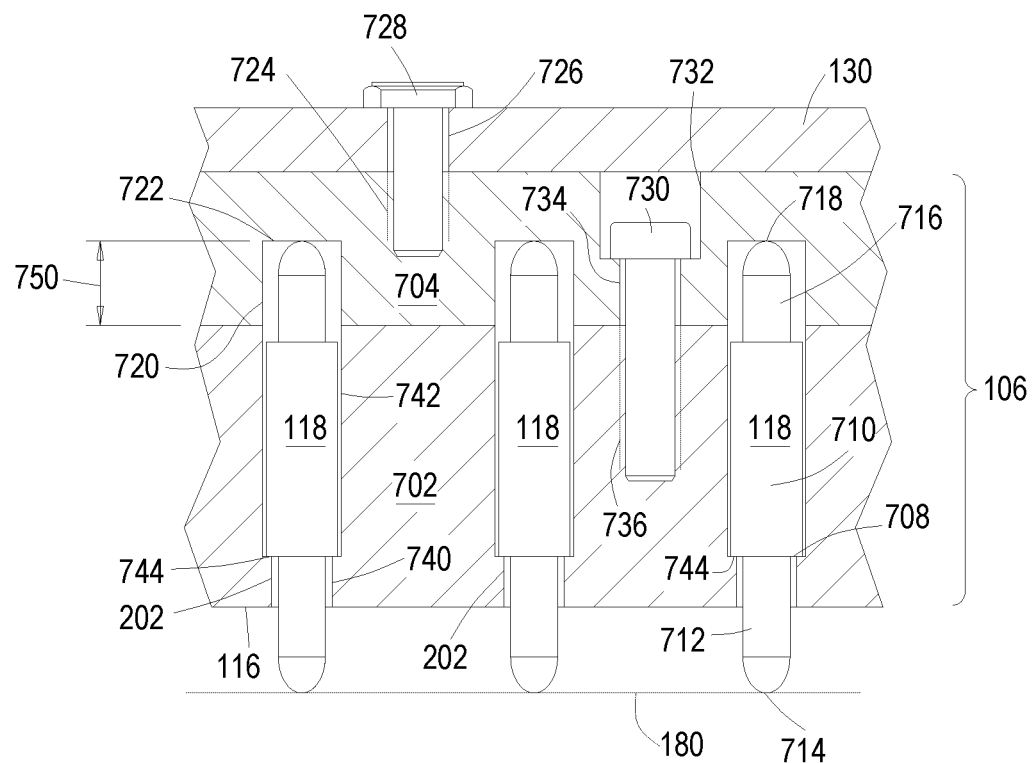
FIGS. 7-10 are schematic partial side views of various configurations of the workpress of FIG. 1, according to various embodiments.

FIG. 7 is a schematic side view of the workpress 106 of FIG. 1. The workpress 106 may be secured to the mounting plate 130 in any suitable manner that allows one workpress to be readily interchanged with another workpress as needed when switching between testing chip package assemblies 160 having different configurations. In the example depicted in FIG. 7, the workpress 106 may be secured to the mounting plate 130 utilizing a fastener 728 that extends through a clearance hole 726 formed in the mounting plate 130 and engages a threaded hole 724 formed in the workpress 106.

The workpress 106 is generally fabricated from aluminum or other sufficiently rigid and dimensionally stable material. The workpress 106 be fabricated as a unitary structure, or fabricated in multiple sections that are coupled together. In the example depicted in FIG. 7, the workpress 106 includes at least a first section 702 and a second section 704 that captures the pusher pins 118 within the workpress 106. A top surface of the first section 702 defines a top surface of the workpress 106. A bottom surface of the second section 704 defines the bottom surface 116 of the workpress 106. The first section 702 may be secured to the second section 704 in any suitable manner that allows the pusher pins 118 to be replaced if needed. For example, the first section 702 may be secured to the second section 704 utilizing a fastener 730 that extends through a clearance hole 734 formed in the first section 702 and engages a threaded hole 736 formed in the second section 704. The clearance hole 734 may also include a counterbore 732 to recess the head of the fasteners 730 below the top surface of the first section 702, thus allowing the first section 702 to be mounted flush against the mounting plate 130.

The pusher pin holes 202 formed through the bottom surface 116 of the workpress 106 and extend through the first sections 702 and at least a portion of the second section 704. The orientation of the pusher pin holes 202 is generally normal to the bottom surface 116 of the workpress 106.

The portion of the pusher pin hole 202 formed through the first section 702 of the workpress 106 includes a first diameter section 740 and a second diameter section 742. The first diameter section 740 exits the first section 702 at the bottom surface 116. The first diameter section 740 has a diameter that is less than a diameter of the second diameter section 742. The transition between the first and second diameter sections 742, 740 forms a step 744. The step 744 is sized to prevent the entire pusher pin 118 from passing completely out of the workpress 106 through the bottom surface 116, as further described below. With the pusher pins 118 installed in the workpress 106, a tip 714 of the pusher pin 118 extends beyond the bottom surface 116 of the workpress 106 by a sufficient amount to allow the pusher pin 118 to engage the chip package assembly 160 and have sufficient travel to apply the desired amount of force to the top surface of the chip package assembly 160. As shown by the dashed line in FIG. 7, the tips 714 of the pusher pins 118 define the bottom 180 of the workpress 106. As the tips 714 of each pusher pin 118 may move independently and separately from the other pusher pins 118, the discrete independent movement and force generation of the pusher pins 118 distributed across the bottom 180 of the workpress 106 enable the bottom 180 to dynamically conform to the topography of the chip package assembly 160 as the workpress 106 is advanced towards the socket 120.

The portion of the pusher pin hole 202 formed through the second section 704 of the workpress 106 includes a hole 720. The hole 720 may be a blind hole having a bottom 722, or may alternatively be formed completely through the second section 704 such that the mounting plate 130 forms the bottom 722 of the hole 720. The bottom 722 of the hole 720 extends a depth 750 from a bottom surface of the second section 704 of the workpress 106. The depth 750, along with the spring constant of the pusher pin 118, is generally selected to set the force that the pusher pin 118 will exert on the chip package assembly 160. Thus, the force generated by each pusher pin 118 disposed in the workpress 106 is controlled by selecting the parameters of the depth 750 of the hole 720, along with the spring constant and the length of the each pusher pin 118. These parameters may be selected to that all the pusher pins 118 exert a uniform force per unit displacement, or that at least one or all of the pusher pins 118 exert different forces per unit displacement.

When the sections 702, 704 are assembled, the second diameter section 742 of the pusher pin hole 202 formed through the first section 702 aligns with the hole 720 to allow the pusher pin 118 to be captured within the hole 202. The sections 702, 704 may readily be disassembled by removing the fastener 730 to allow replacement of damaged pusher pins 118, or to replace one or more pusher pins 118 with pins 118 having a different spring force. In this manner, different ones of the pusher pins 118 may apply different forces to local areas of the top of the chip package assembly 160.

The pusher pin 118 shown disposed in the hole 202 includes a first plunger 712, a case 710, and a second plunger 716. The case 710 generally has a diameter greater than that of the plungers 712, 716, but less than that of the second diameter section 742 of the portion of the pusher pin hole 202 formed through the first section 702 of the workpress 106. The first plunger 712 has a diameter selected to travel freely within the first diameter section 740 the pusher pin hole 202. The case 710 includes a shoulder 708 defined between the outside diameter of the case 710 and the first plunger 712. The shoulder 708 contacts the step 744 so that the case 710 of the pusher pin 118 is prevented from passing completely out the bottom surface 116 of the workpress 106 through the first diameter section 740 of the pusher pin hole 202.

Figure 8:
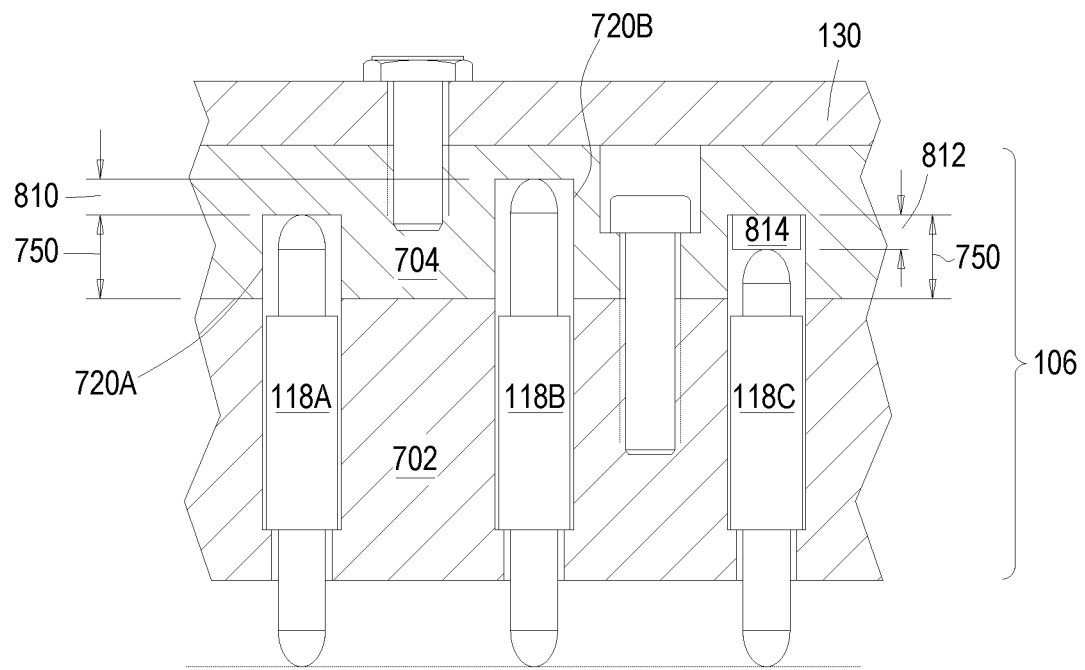

FIG. 8 is a schematic side view of another embodiment the workpress 106 of FIG. 1 configured to provide different forces to local areas of the top of the chip package assembly 160. The workpress 106 depicted in FIG. 8 is constructed essentially the same as the workpress 106 depicted in FIG. 7, except wherein at least one or more holes 720 formed in the second section 704 is configured to change the effective depth of the hole 720, thereby adjusting the force applied by the pusher pin 118 disposed in that hole 720. For example, one hole 720 may have a depth 750 while another one of the holes 720 may have a depth that is different by an amount 810. Although the amount 810 illustrated in FIG. 8 indicates that the hole $720_B$ is deeper than the hole $720_A$, the hole $720_B$ may alternatively be shallower than the hole $720_A$. Thus, in the example depicted in FIG. 8, the force generated by identical pusher pins $118_A$, $118_B$ respectively disposed in holes $720_A$, $720_B$ will result in the pusher pin $118_A$ applying more force to the chip package assembly 160 relative to the pusher pin $118_B$. The difference in force may further be tailored (e.g., selected) by utilizing pusher pins $118_A$, $118_B$ that have at least one of stoke or spring constant different than the other pin.

Figure 9:
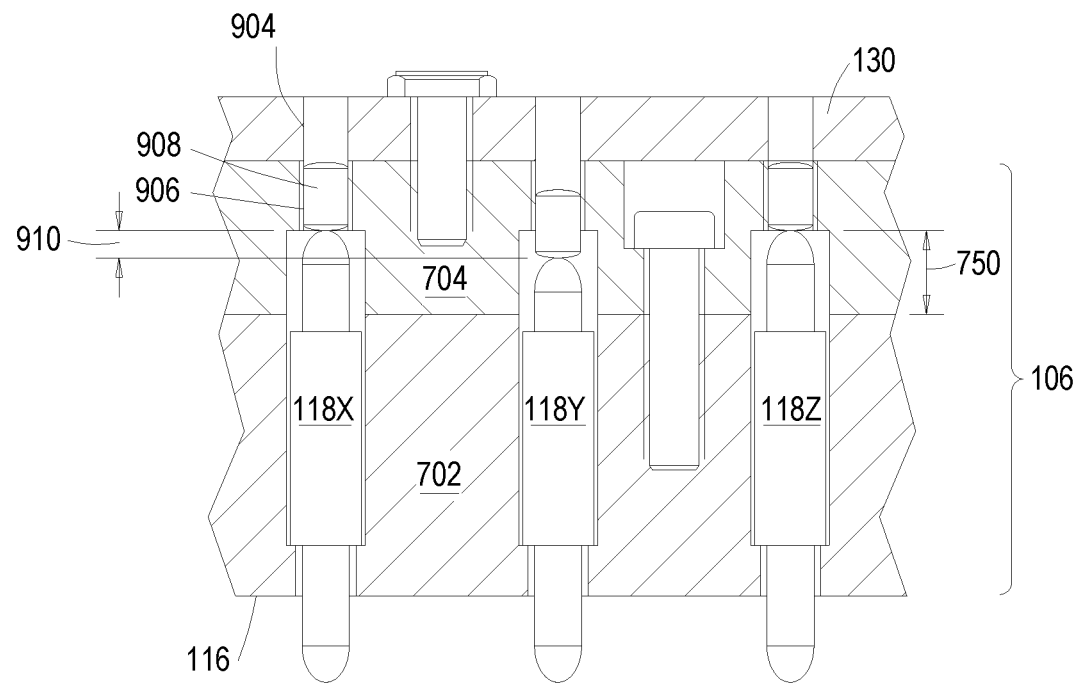

The effective depth of the hole 720 may also be changed by inserting a spacer 814 within the hole 720, as depicted in the partial sectional view of the workpress 106 illustrated in FIG. 9. The spacer 814 reduces the depth 750 of the hole 720 by a thickness 812 of the spacer 814. Thus, the force generated by identical pusher pins $118_A$, $118_C$ disposed in holes 720 having the same depth 750 will result in the pusher pin $118_C$ applying more force to the chip package assembly 160 relative to the pusher pin $118_A$.

Figure 10:
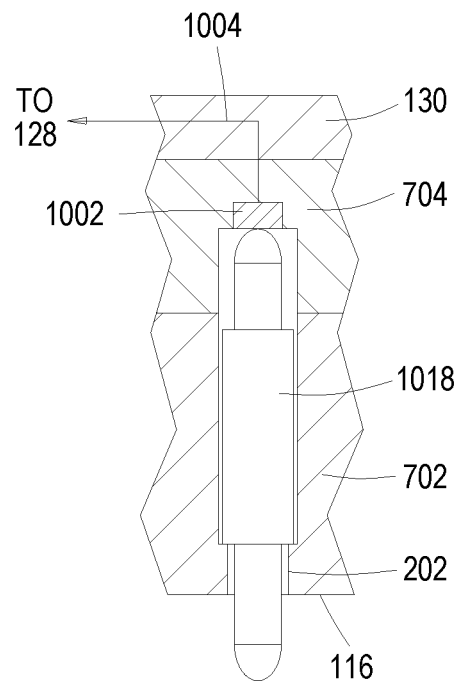

The effective depth of the hole 720 may also be changed by protruding an object through the bottom 722 of the hole 720 as depicted in the partial sectional view of the workpress 106 illustrated in FIG. 10. In FIG. 10, a set screw 908 is shown engaged with a threaded hole 906 formed in the second section 704 of the workpress 106. The threaded hole 906 opens into the hole 720. The set screw 908 disposed within the threaded hole 906 may be access through a clearance hole 904 formed through mounting plate 130, thereby allowing adjustment of the set screw 908 after the workpress 106 has been secured to the mounting plate 130. The set screw 908 may be advanced into the hole 720 a distance 910, and compresses the pusher pin $118_Y$ more than the pusher pins $118_X$, $118_Z$ residing in the holes 720 having the same depth 750. The set screw 908 reduces the effective depth (i.e., depth 750 less the distance 910) of the hole 720 by the distance 910 that the set screw 908 extends into the hole 720. Thus, the force generated by identical pusher pins $118_Y$, $118_Z$ will result in the pusher pin $118_Y$ applying more force to the chip package assembly 160 relative to the pusher pin $118_Z$.

Although a set screw 908 is illustrated in FIG. 9 as the object protruding into the hole 720, other objects that may be utilized in place of the set screw 908 include other threaded fasteners, threaded elements, linear actuators, ball or lead screws, solenoids, and other actuators suitable for controllably displacing an end of the pusher pin 118 disposed in the hole 720, thereby adjusting the force generated by the pusher pin 118 upon contact with the chip package assembly 160.

FIG. 10 is another schematic partial side view of the workpress 106 of FIG. 1 having a conductive pusher pin 1018. The conductive pusher pin 1018 may be a commercially available spring pin that suitable for high frequency signal transmission through the pusher pin 1018. The pusher pin 1018 may also be constructed similar to any of the pusher pins 118 described below with reference to FIGS. 14-20, with the exception that the pusher pin 1018 is conductive tip to tip.

The conductive pusher pin 1018 may advantageously be utilized to provide communication between the test controller 128 and the test pad 174 disposed on the top surface of the chip package assembly 160. The conductive pusher pin 1018 is electrically coupled to a conductive pad 1002 disposed in the bottom of the hole 202. The conductive pad 1002 is coupled by wiring 1004 routed out through the workpress 106 to the test controller 128. The conductive pusher pin 1018 advantageously allows the test controller 128 to communicate with the chip package assembly 160 without having to utilize routings connected through the contact pads 124 of the test socket 120. An exemplary routing 1102 formed through the package substrate 162 and coupling the test pad 174 to circuitry 1106 of the die 170 is illustrated in FIG. 11.

Figure 11:
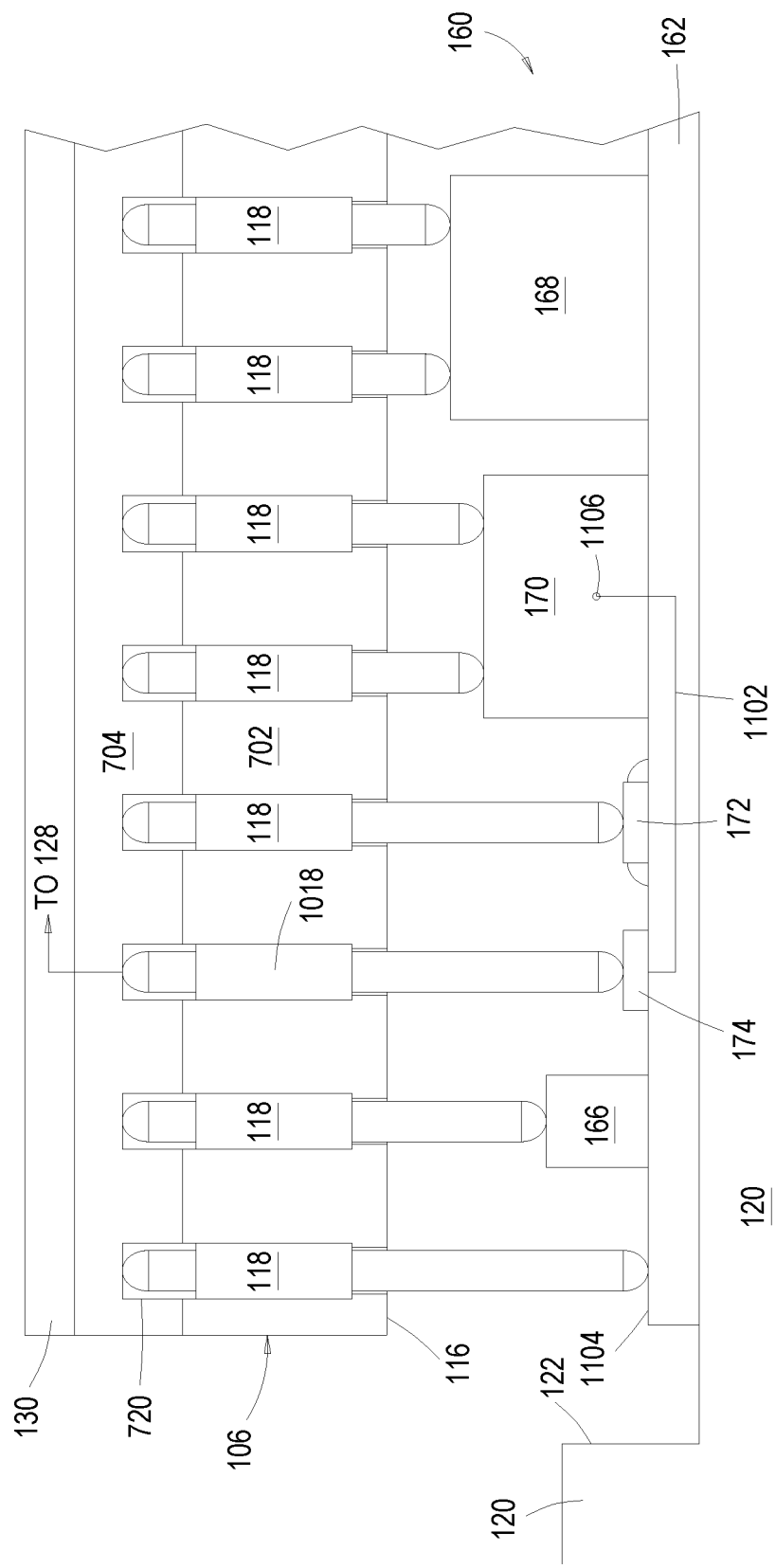
FIGS. 11-13 illustrate various workpresses engaging a chip package assembly disposed in the automated test system of FIG. 1, according to various embodiments.

FIG. 11 is a partial sectional view of the workpress 106 engaging the chip package assembly 160 disposed in the socket 120 of the automated test system 100 of FIG. 1. As the actuator 108 advances the workpress 106 towards the socket 120, the pusher pins 118 (and 1018, if present) come in contact with the various components of the chip package assembly 160. As the various components of the chip package assembly 160 (e.g., a top surface 1104 of the package substrate 162, the stiffener 166, the surface mounted circuit elements 172, the test pad 174, and the dice 168, 170) generally have an uneven topography as illustrated in FIG. 11, the stoke of the pusher pins 118, 1018 is sufficient to accommodate the different heights that the component extend above the top surface 1104 of the package substrate 162 while still applying a desired force to the chip package assembly 160. Since the pusher pins 118 may be configured to apply a small force to desired locations, force may be advantageously applied to fragile components, such as surface mounted circuit elements 172, without fear of damage to the circuit elements 172 or shorting between adjacent pins 118 or other components of the chip package assembly 160 due to the non-conductive nature of the pusher pin 118. Moreover, as the force is generally distributed across the entire chip package assembly 160, robust connections between the solder bumps 164 and contact pads 124 is advantageously realized. Additionally, the stoke of the pusher pins 118 enables adjacent surfaces of varying heights, such as the tops of the dice 168, 170, to be accommodated without fear of overstressing the higher die (e.g., die 168) as would be the case with conventional workpresses having non-conforming package contact surfaces.

Figure 12:
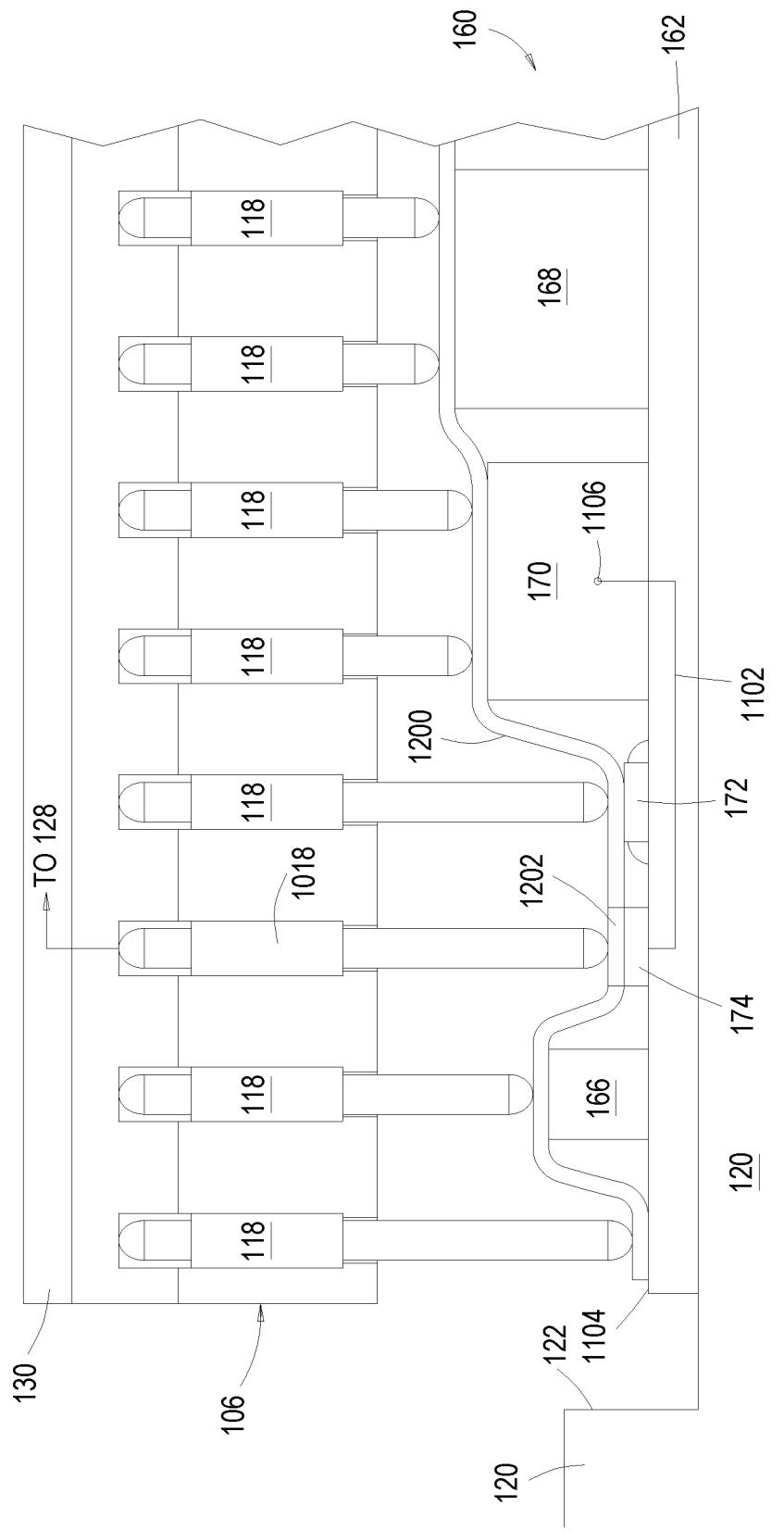

FIG. 12 is another partial sectional view of the workpress 106 engaging the chip package assembly 160 disposed in the socket 120 of the automated test system 100 of FIG. 1. In FIG. 12, the workpress 106 has a layer of thermal interface material (TIM) 1200 disposed between the tips 714 of the pusher pins 118 and the components of the chip package assembly 160. The TIM 1200 may be utilized to further spread and distribute the force of the pins 118 across the top surface of the chip package assembly 160.

In the example depicted in FIG. 12, the TIM 1200 is in the form of a sheet of compliant material. The sheet of TIM 1200 may include a hole 1202 positioned above the test pad 174, thereby facilitating direct contact between the conductive pusher pin 1018 and the test pad 174 so that signal transmission may be maintained.

Figure 13:
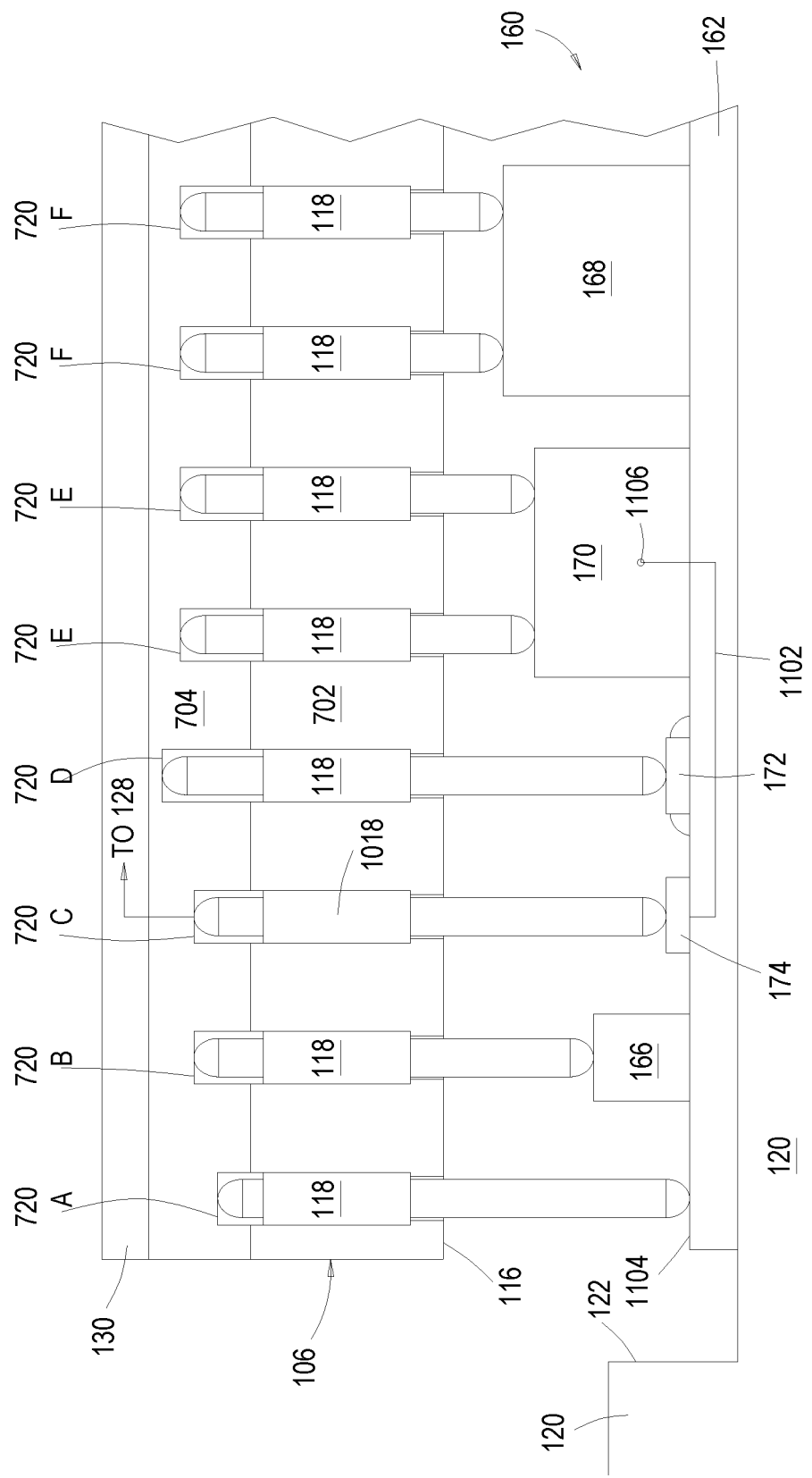

FIG. 13 is another partial sectional view of the workpress 106 engaging the chip package assembly 160 disposed in the socket 120 of the automated test system 100 of FIG. 1. In FIG. 13, the second section 704 of the workpress 106 has holes 720 of varying depths so that the force applied by the pusher pins 118 may be best tailored to suit the height and type of package component that an individual pin 118 contacts during testing of the chip package assembly 160. As discussed above, the force generated by each pusher pin 118 disposed in the workpress 106 is controlled by selecting the parameters of the depth 750 of the hole 720, along with the spring constant and the length of the each pusher pin 118. These parameters may be selected to that all the pusher pins 118 exert a uniform force per unit displacement, or that at least one or all of the pusher pins 118 exert different forces per unit displacement.

For example, it may be desirable for the pusher pin 118 contacting the top surface 1104 of the package substrate 162 to apply a relatively higher force than the pusher pin 118 contacting the top of the die 170. Thus, the pusher pin 118 contacting the top surface 1104 of the package substrate 162 may be disposed in a hole $720_A$ that is shallower than the hole $720_E$ in which the pusher pin 118 contacting the top of the die 170 is disposed. Similarly, it may be desirable for the pusher pin 118 contacting the top surface of the stiffener 166 to apply a relatively high force, and thus the pusher pin 118 contacting the top surface of the stiffener 166 may be disposed in a hole $720_B$ that is shallower in proportion to the difference that the stiffener 166 and die 170 project above the top surface 1104 of the package substrate 162 than the hole $720_E$ in which the pusher pin 118 contacting the top of the die 170 is disposed. Furthermore, it may be desirable for the pusher pin 118 contacting the top surface of the test pad 174 to apply a relatively higher force than a force applied to the surface mounted circuit elements 172 even though the surface mounted circuit elements 172 and test pad 174 extend about the same amount above the top surface 1104 of the package substrate 162. Thus the pusher pin 118 contacting the test pad 174 may be disposed in the hole $720_C$ that is shallower than the hole $720_D$ in which the pusher pin 118 contacting the and surface mounted circuit elements 172 is disposed. Similarly, it may be desirable for the pusher pin 118 contacting the top surface of the die 170 to apply about the same force as the pusher pin 118 contacting the top surface of the die 168. Since the die 168 has a top surface that extends to a greater height above the top surface 1104 of the package substrate 162 than the die 170, the pusher pin 118 contacting the die 168 may be disposed in the hole $720_E$ that is shallower than the hole $720_F$ in which the pusher pin 118 contacting the and die 168 is disposed so that the forces applied to both dice 168, 170 are essentially equal.

Although FIGS. 11-13 provide example having the appearance of a uniform distribution of pusher pins 118, any pusher pins distribution described above, such as but not limited to that described with reference to FIGS. 2-6 may be utilized. Moreover, the pusher pins 118 are not limited to having a uniform stoke, spring constant or force per unit displacement, but rather any one or more of the pusher pins 118 disposed in the workpress assembly 104 may have one or more of the stoke, spring constant or force per unit displacement different than one or more other pusher pins 118 disposed within the same workpress assembly 104.

Figure 14:
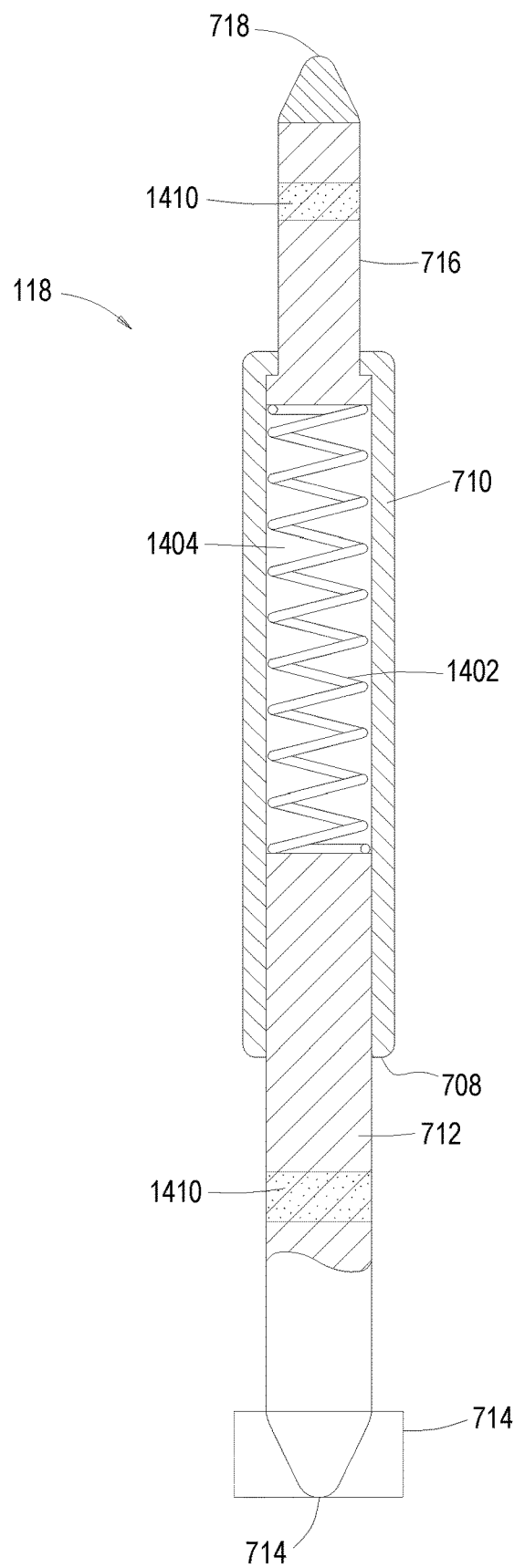
FIG. 14 is a side view of an exemplary pusher pin, according to an embodiment.

FIG. 14 show a perspective of an exemplary pusher pin 118. The pusher pin 118, which may be adapted from a pogo pin, pusher pin, buckling pin, cobra pin, microelectromechanical (MEMS) pin and the like, includes a first plunger 712, a second plunger 716 and a spring 1402. In one example, the plungers 712, 716 may be displaced axially through a distance (e.g., stroke) of about 0.5 to about 2.5 millimeters. In one example, an electrically insulative (e.g., discontinuous) path is defined between the exposed opposite ends of the first and second plunger 712, 716 through the pusher pin 118. The electrically insulative path defined through the pusher pin 118 prevents the pusher pin 118 from inadvertently shorting circuits that may be in contact with the pusher pin 118 when in use. It is noted that the pusher pin 118 described herein although for use with DUTs, is not intended for use in locations that require communication of an electric signal, ground or power for which a conductive pusher pin, such as the conductive pusher pin 1018 or equivalent, is utilized.

At least one of the tip 714 of the first plunger 712, the first plunger 712, the second plunger 716 and a tip 718 of the second plunger 716 is fabricated from, has a portion thereof, and/or is coated with a dielectric material that provides electrical signal isolation (i.e., non-transmission) through the pusher pin 118. In the example depicted in FIG. 14, several examples locations of where dielectric portions 1410 that generate an electrical discontinuity through the pusher pin 118 are illustrated.

The pusher pin 118 may be fabricated from a material suitably rigid enough to withstand an axial compression force exerted on the pusher pin 118 when in use with a DUT. For example, the pusher pin 118 is configured to withstand axial compression force of up to about 1600 grams In one example, the pusher pin 118 maybe fabricated from a carbon-based materials, fiber-reinforced plastic, metals, rigid polymers or other suitable material. Suitable metals include brass, stainless steel, beryllium copper and titanium, among others. The pusher pin 118 maybe fabricated form one or more materials, and in one example, at least a portion 1410 of the pusher pin 118 is fabricated from a dielectric material so that the pusher pin 118 is not conductive from tip 714 to tip 718.

The spring 1402 is fabricated from a conductive or non-conductive material and is disposed between the first plunger 712 and the second plunger 716. The spring 1402 biases the first plunger 712 away from the second plunger 716. The spring 1402 may be disposed within or outside of the case 710. In the example depicted in FIG. 14, the spring 1402 is disposed in a cavity 1404 of the case 710. In one example, the spring 1402 is selected to generate a force of between about 0.15 to 1.00 newtons (N) at about half the stroke of the second plunger 716.

As discussed above, an electrically insulative path is defined through the pusher pin 118. That is, an open circuit is formed between the tips 714, 718 of the plungers 712, 716 that defined the length of the pusher pin 118. The electrically insulative path defined through the pusher pin 118 generally prevents the pusher pin 118 from inadvertently shorting circuits that may be in contact with the tips 714, 718 of the pusher pin 118 when in use. To achieve an electrically insulative path through the pusher pin 118, various elements of the pusher pin 118 may be made of or coated with an electrically insulative material so that an open circuit is formed between exposed tips 714, 718 of the pusher pin 118 as discussed above. The electrically insulative material may be a ceramic, a form of rubber or latex, plastic, glass, or other suitable electrically insulative material. The electrically insulative material may also be an electrically non-conductive coating applied over a dielectric or conductive base material. The electrically non-conductive coating may comprise a thin film of ceramic, a form of rubber or latex, plastic, glass, or other suitable electrically insulative material.

Optionally and as additionally shown in FIG. 14, the tip 714, such may optionally be electrically insulative, may have a width that is wider than an outer diameter of the case 710, as shown in phantom. The wide tip 714, as shown in phantom, advantageously distributes the force generated by the pusher pin 118 across a larger area when contacting a die or other DUT, thus reducing the pressure applied to the DUT and decreasing the probability of the DUT becoming damaged through interaction with the pusher pin 118. Additionally, in embodiments where the tip 714 is electrically insulative, the tip 714 cannot short adjacent circuits that are in contact with the tip 714, thus allowing the use of the pusher pin 118 with near and even in contact with solder connections and exposed circuit elements, such as the surface mounted circuit elements 172.

Figure 15:
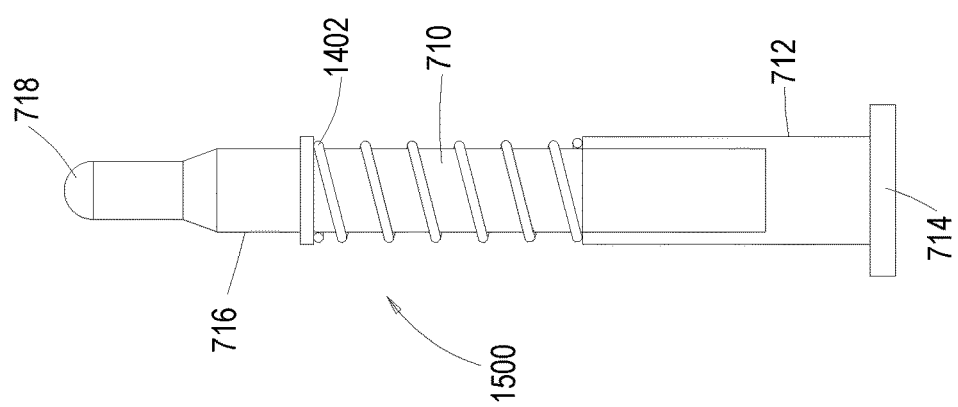
FIG. 15 is a side view of an exemplary pusher pin having an external spring, according to an embodiment.

FIG. 15 is a perspective of an exemplary pusher pin 1500 having an electrically insulative path defined therethrough. The pusher pin 1500 may be fabricated the same as the pusher pin 118 described above, except wherein the spring 1402 is disposed on the exterior of the case 710.

In the example depicted in FIG. 15, the tip 714 is electrically insulative to provide the electrically insulative path defined through the pusher pin 1500. The electrically insulative tip 714 may be fabricated from a ceramic, a form of rubber or latex, plastic, glass, or other suitable electrically insulative material. The electrically insulative tip 714 may alternatively be fabricated with an electrically non-conductive coating applied over a dielectric or conductive base material, the coating comprised a thin film of ceramic, a form of rubber or latex, plastic, glass, or other suitable electrically insulative material. The electrically insulative tip 714 provides an open circuit between the tips 714, 718 of the pusher pin 118, thus making the pusher pin 118 non-conductive.

The enlarged width of the electrically insulative tip 714 advantageously distributes the force generated by the pusher pin 118 across a larger area when contacting a die or other DUT as compared to conventional pusher pins, thus decreasing the probability of the DUT becoming damaged through interaction with the pusher pin 118.

Figure 16:
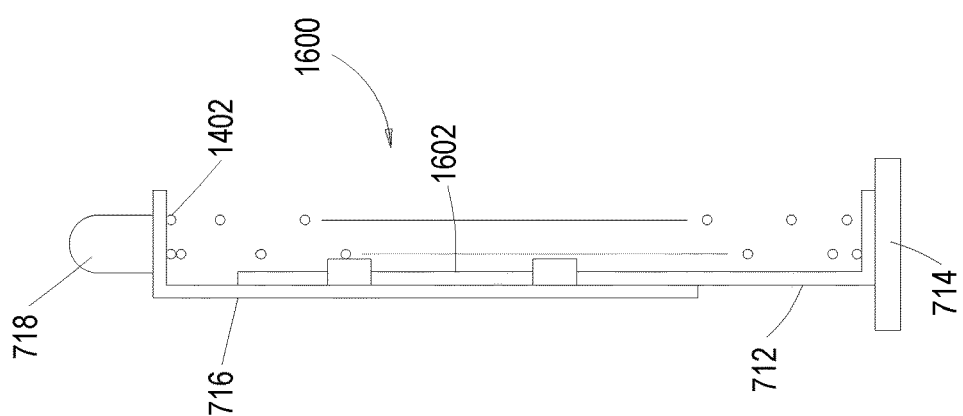
FIG. 16 is a side view of an exemplary pusher pin having a slide mechanism coupling the plunger members of the pusher pin, according to an embodiment.

FIG. 16 is a perspective of an exemplary pusher pin 1600 having an electrically insulative path defined therethrough. The pusher pin 1600 may be fabricated the same as the pusher pins 118, 1500 described above, except wherein the exemplary pusher pin 1600 has a slide mechanism 1102 coupling the plungers 712, 716. The slide mechanism 1102 allows one plunger member, e.g., the plunger 712, to slide linearly relative to the other plunger member, e.g., the plunger 716. The slide mechanism 1102 may be configured as any suitable linear slide, such as one or more guides slideably mounted to a rail, that enables the plungers 712, 716 to move relative to each other. A spring 1402 is coupled to the plungers 712, 716 and biases the tips 714, 718 of the pin 1600 in opposite directions.

The plungers 712, 716 may be fabricated from a stamped material, such as a metal, or be machined, casted, molded or otherwise formed. Alternatively, the plungers 712, 716 may be extruded, molded or otherwise formed from a rigid plastic.

The pusher pin 1600 has an electrically insulative path defined between opposite tips 714, 718 of the pusher pin 1600. The electrically insulative path defined between the opposite tips 714, 718 of the pusher pin 1600 may be realized in any number of ways. For example, the tip 714 of a first plunger 712 may include an electrically insulative tip 714. In another example, a tip 718 of a second plunger 716 may include an electrically insulative tip 714. Alternatively, at least one of the first and second plungers 712, 716 may be fabricated from or coated with an electrically insulative material, or include an electrically insulative portion that prevents electrical conduction between the opposite tips 714, 718 of the pusher pin 1600, such as described above.

Figure 18:
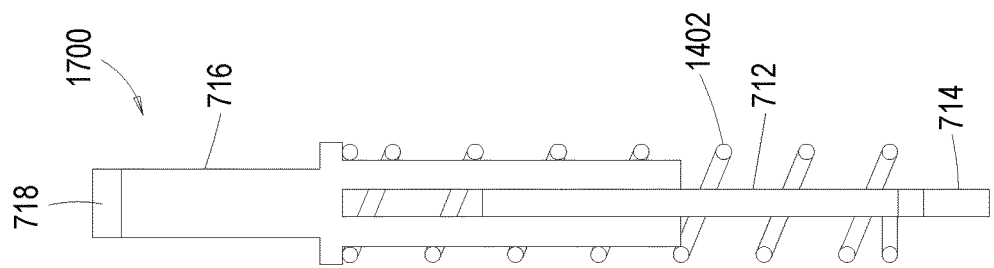
FIGS. 17-18 are side and front views of an exemplary pusher pin having an external spring, according to an embodiment.
Figure 17:
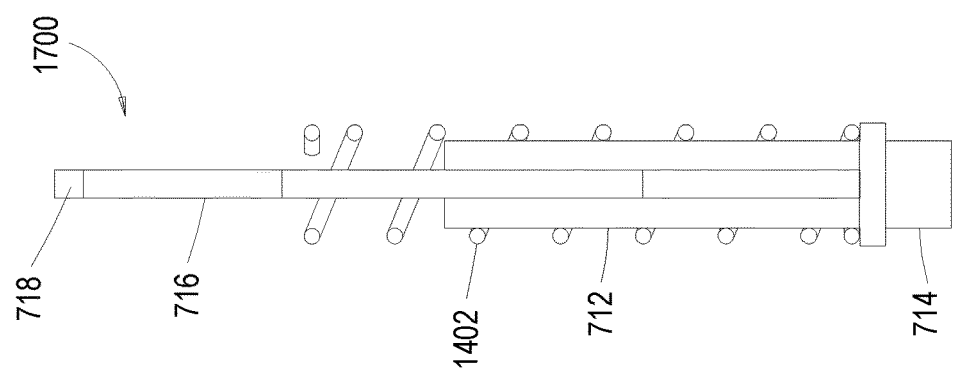

FIGS. 17-18 are side and front views of an exemplary pusher pin 1700 having an external spring 1402, according to an embodiment. The pusher pin 1700 is configured with first and second plungers 712, 716 having an "H" configuration that guides the relative motion between the plungers 712, 716. In the embodiment depicted in FIGS. 17-18, each plunger 712, 716 has a flat form that is turned at an angle, such as 30-90 degrees, relative to the other plunger 712, 716 so that the legs of the "H" configuration of each plunger 712, 716 can engage with each other. The plungers 712, 716 may be fabricated from stamped materials, such as metals or rigid plastic.

As with the other pins described above, the pusher pin 1700 has an electrically insulative path defined between opposite tips 714, 718 of the pusher pin 1700. The electrically insulative path defined between the opposite tips 714, 718 of the pusher pin 1600 may be realized in any number of ways. For example, the tip 714 of a first plunger 712 may include an electrically insulative tip 714. In another example, a tip 718 of a second plunger 716 may include an electrically insulative tip 714. Alternatively, at least one of the first and second plungers 712, 716 may be fabricated from or coated with an electrically insulative material, or include an electrically insulative portion that prevents electrical conduction between the opposite tips 714, 718 of the pusher pin 1700, such as described with reference to FIGS. 4-7.

Figure 19:
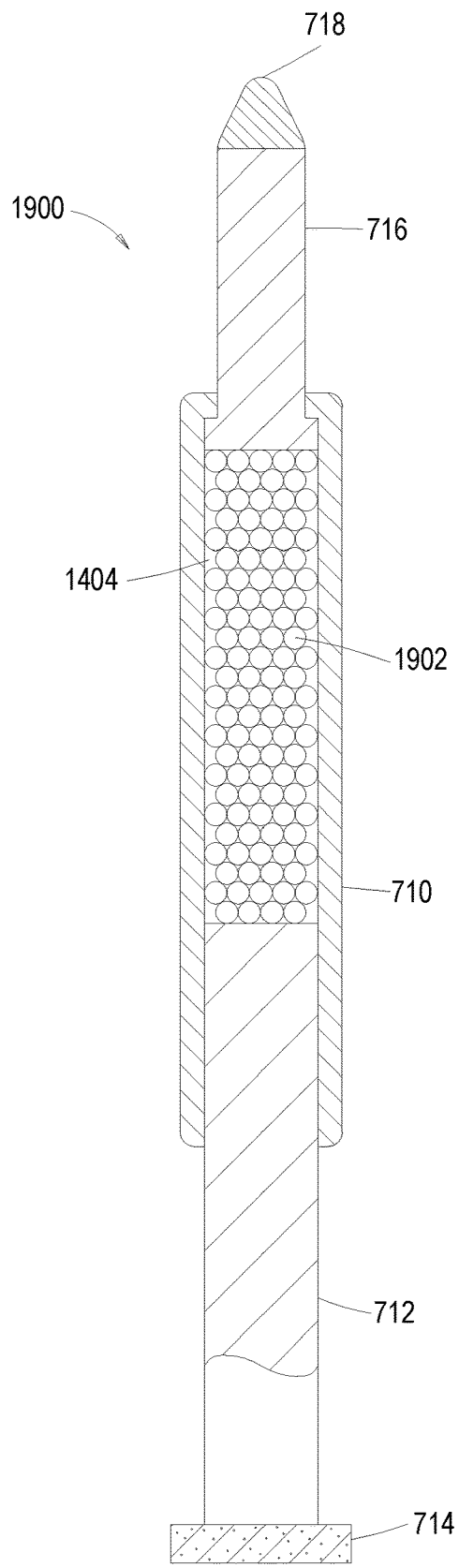
FIG. 19 is a sectional view of an exemplary pusher pin having a spring fabricated from a compressible material, according to an embodiment.

FIG. 19 is a sectional view of an exemplary pusher pin 1900 having a spring 1902 fabricated from a compressible, resilient material. The compressible, resilient material comprising the spring 1902 may be fabricated from foam, an elastomer or plastic spheres. The spring 1902 may be fabricated from electrically conductive or insulative material.

As with the other pins described above, the pusher pin 1900 has an electrically insulative path defined between opposite tips 714, 718 of the pusher pin 1900. The electrically insulative path defined between the opposite tips 714, 718 of the pusher pin 1900 may be realized in any number of ways. For example, the tip 714 of a first plunger 712 may include an electrically insulative material. In another example, a tip 718 of a second plunger 716 may include an electrically insulative material. Alternatively, at least one of the first and second plungers 712, 716 may be fabricated from or coated with an electrically insulative material, or include an electrically insulative portion that prevents electrical conduction between the opposite tips 714, 718 of the pusher pin 1400, such as described above.

Figure 20:
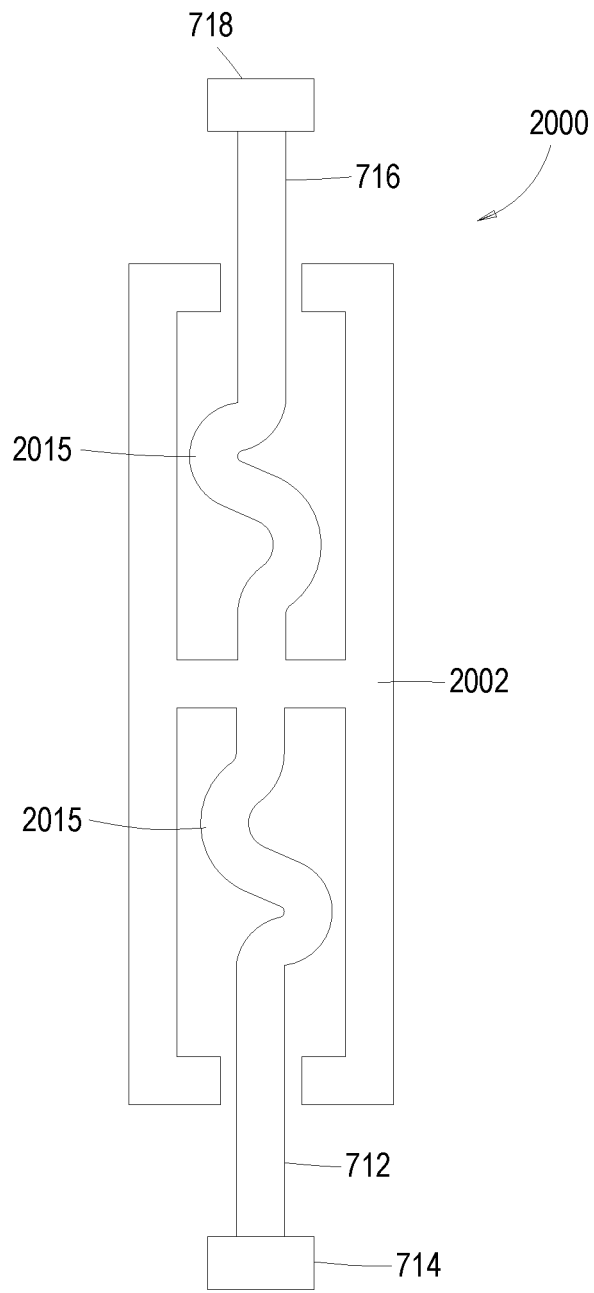
FIG. 20 is a side view of an exemplary pusher pin having a unitary construction that incorporates a spring form, according to an embodiment.

FIG. 20 is a side view of an exemplary pusher pin 2000 having a unitary construction that incorporates a spring form, according to an embodiment. That is, at least one spring 2015 and the plungers 712, 716 are made from a single mass of material to provide the unitary construction. For example, the unitary construction may be achieved through stamping, machining, MEMS fabrication techniques, 3D printing or other suitable technique.

In the embodiment depicted in FIG. 20, two springs 2015 are utilized which are coupled to a frame 2002 at one end. The opposite ends (e.g., tips 714, 718) of each spring 2015 are coupled to a respective one of the plungers 712, 716. In one example, the springs 2015 are flat springs.

The frame 2002 laterally surrounds the plungers 712, 716 and springs 2015 to provide a guide that orients the pusher pin 2000 within the receiving hole in which the pusher pin 2000 is formed. The tips 714, 718 extend axially through a gap in the frame 2002 a sufficient distance to allow a desired range of motion of the plungers 712, 716 without the tips 714, 718 retracting within the bounds of the frame 2002.

As with the other pins described above, the pusher pin 2000 has an electrically insulative path defined between opposite tips 714, 718 of the pusher pin 2000. The electrically insulative path defined between the opposite tips 714, 718 of the pusher pin 1600 may be realized in any number of ways. For example, the tip 714 of a first plunger 712 may include an electrically insulative tip 714. In another example, a tip 718 of a second plunger 716 may include an electrically insulative tip 714. Alternatively, at least one of the first and second plungers 712, 716, springs 2015 may be fabricated from or coated with an electrically insulative material, or include an electrically insulative portion that prevents electrical conduction between the opposite tips 714, 718 of the pusher pin 2000, such as described with reference to FIGS. 4-7. In yet another example, the portion of the frame 2002 separating the springs 2015 may be fabricated from or coated with an electrically insulative so as to provide an open circuit between the tips 714, 718 of the pusher pin 2000.

With all the pusher pins described above, the pusher pins may be sized to allow a pitch between axially aligned pusher pins of 1.0 mm centerline to centerline pitch. In other examples, the centerline to centerline pitch may be as small as 0.4 mm. The end to end (i.e., between the tips 714, 718) range of motion (i.e., axial displacement) of the pusher pins may be in the range of 0.7 to 2.0 mm. The pusher pins may generate between 5.0 and 0.15 newtons of force.

Figure 21:
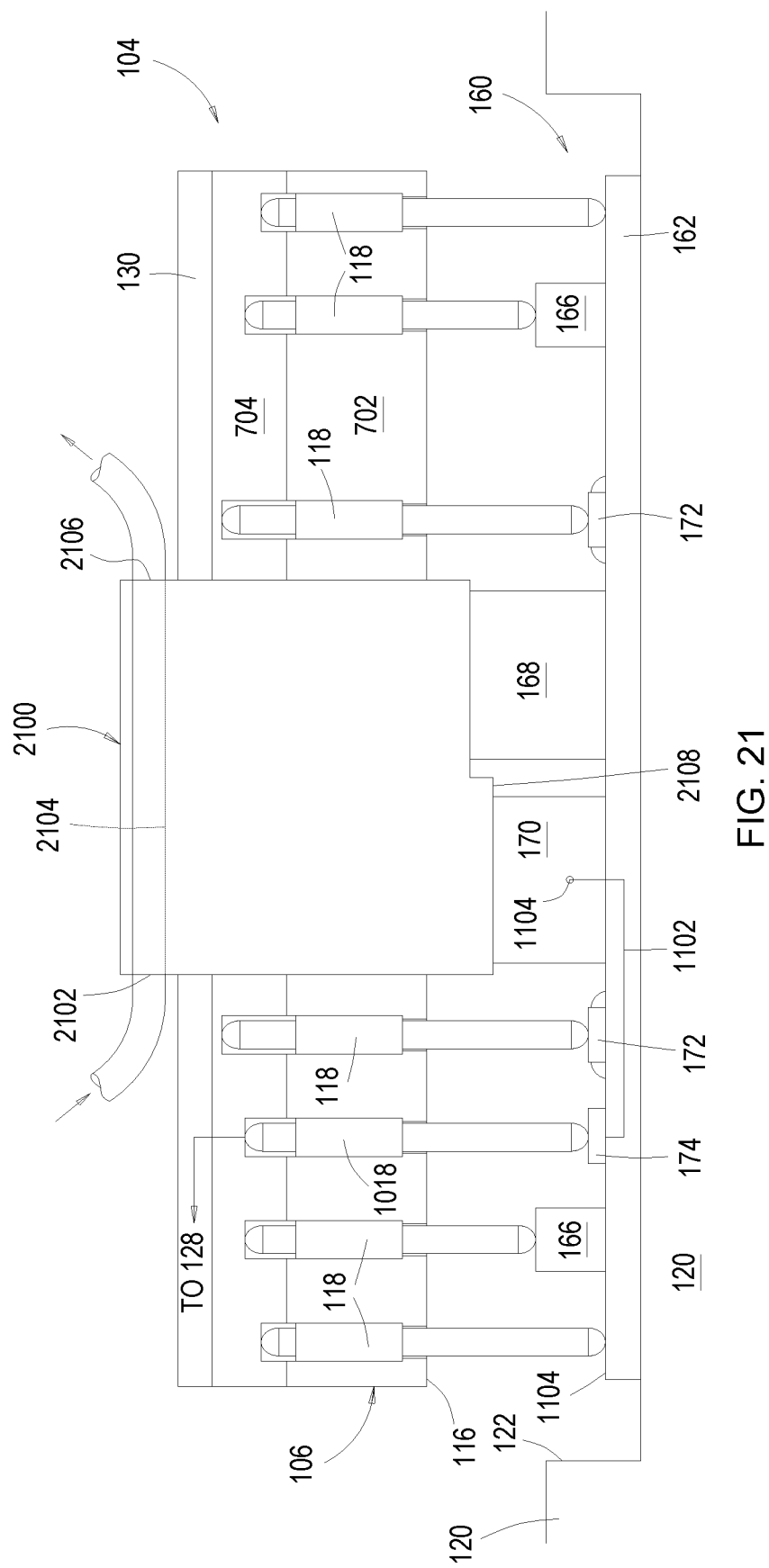
FIG. 21 is a side view of a workpress of the chip package assembly test system of FIG. 1 having a temperature control block.

FIG. 21 is a side view of a workpress 106 of the chip package assembly test system 100 of FIG. 1 having an optional temperature control block 2100. The temperature control block 2100 is integrated into the workpress 106 such that a lower surface 2108 of the temperature control block 2100 is exposed to the chip package assembly 160 disposed in the socket 120 through the bottom surface 116 of the workpress 106. The temperature control block 2100 may be coupled to the workpress 106 directly, or alternatively coupled to the mounting plate 130.

The lower surface 2108 of the temperature control block 2100 may be contoured to substantially conform with the topography of the dice 168, 170 mounted to the package substrate 162. Stated differently, the lower surface 2108 of the temperature control block 2100 may have a geometry that mates with the top surfaces of each die 168, 170 even though each die 168, 170 extends to a different height above the top surface 1104 of the package substrate 162. For example, the lower surface 2108 of the temperature control block 2100 may include one or more regions of parallel planar surfaces, such as steps, wherein each region is configured to engage and mate with a top surface of a respective one of the dice 168, 170.

The temperature control block 2100 may additionally include at least one cooling channel 2104 (shown in phantom in FIG. 21). The channel 2104 extends between an inlet port 2102 and an outlet port 2106 formed in the temperature control block 2100. The inlet and outlet ports 2102, 2106 allow a cooling medium, such as water, oil, refrigerant, liquid nitrogen and the like, to be circulated through the channel 2104, thus cooling the block 2100 and effectively sinking heat generated from the dice 168, 170 under test. In another example, the temperature control block 2100 may be utilized to heat the dice 168, 170 undergoing a high temperature test, for example by using heated fluid circulated through the channel 2104 or by utilizing a resistive heater disposed in or on the temperature control block 2100.

Figure 22:
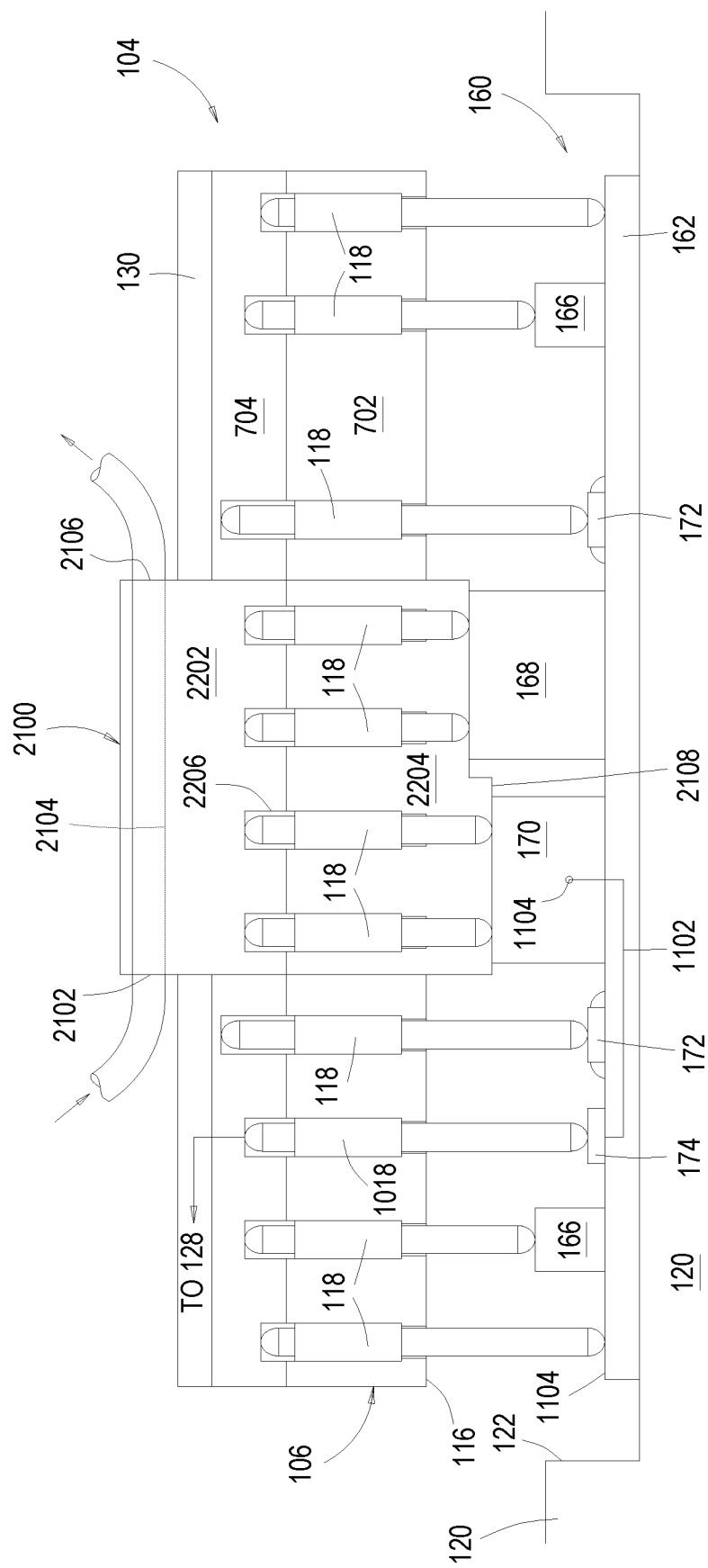
FIG. 22 is a side view of a workpress of the chip package assembly test system of FIG. 1 having a temperature control block with integrated pusher pins.

FIG. 22 is a side view of a workpress 106 of the chip package assembly test system 100 of FIG. 1 having an optional temperature control block 2100 that includes integrated pusher pins 118. The workpress 106 of FIG. 22 is constructed essentially the same as the workpress 106 of FIG. 22 except that the workpress 106 of FIG. 22 include a plurality of pusher pins 118 for contacting the dice 168, 170.

In the example depicted in FIG. 22, the temperature control block 2100 is split into two sections 2202, 2204 to enable the fabrication of pusher pin holes 2206. The pusher pin holes 2206 are fabricated in the sections 2202, 2204 of the temperature control block 2100 similar to the holes 202 fabricated in the sections 702, 704 of the workpress 106 such that the pusher pins 118 are captured within the temperature control block 2100.

Figure 23:
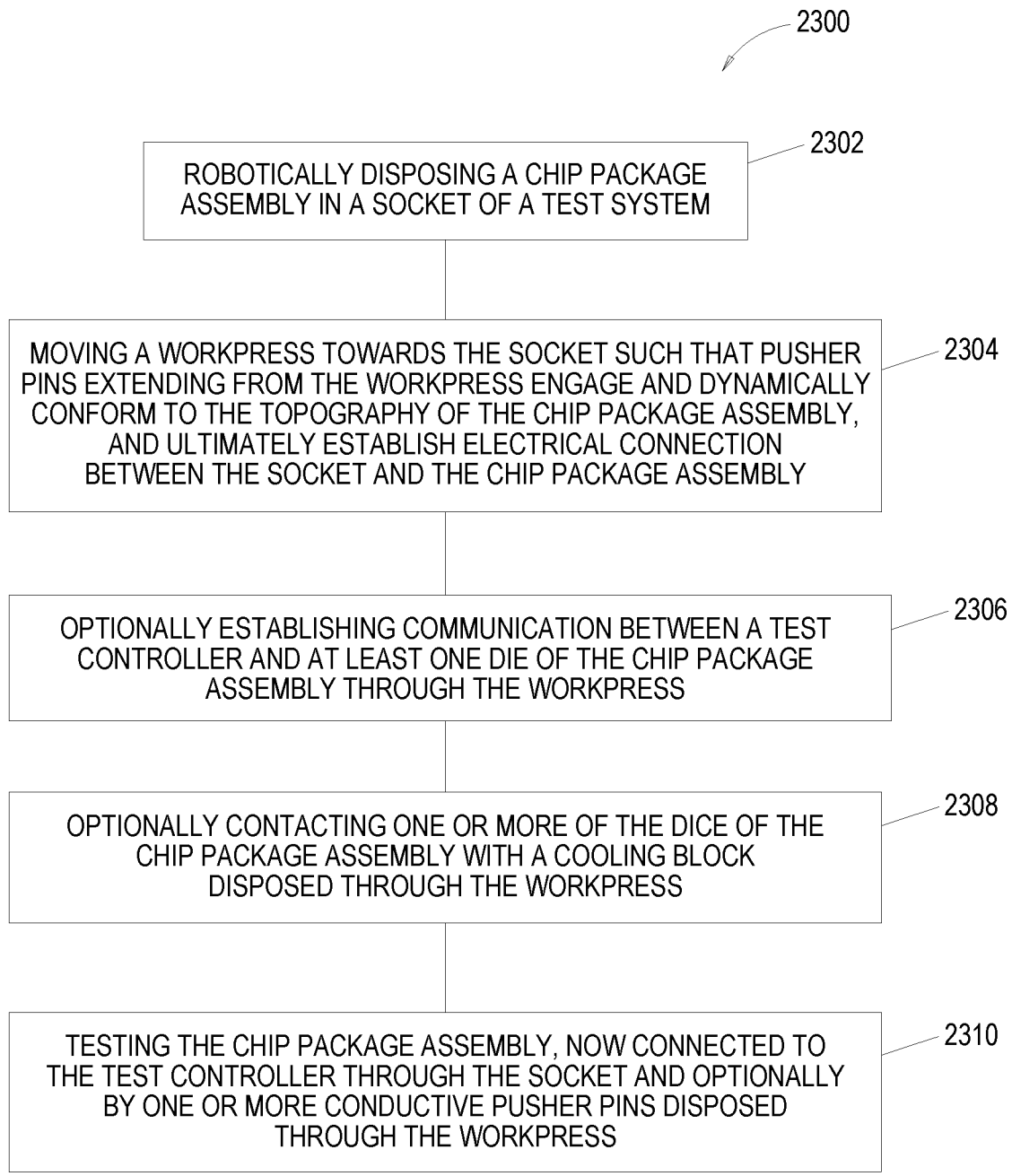
FIG. 23 is a flow diagram of a method for testing a chip package assembly.

Although not shown, a layer of TIM, such as the TIM 1200 illustrated in FIG. 12, may optionally be utilized between the temperature control block 2100 and dice 168, 170 in either of the examples described in FIGS. 23-22. Moreover, the temperature control block 2100 may be incorporated in any of the examples described in FIGS. 2-9.

FIG. 23 is a flow diagram of a method 2300 for testing a chip package assembly, such as the chip package assembly 160 or other suitable chip package. The method 2300 begins at operation 2302 by robotically disposing a chip package assembly 160 in the socket 120 of the test system 100.

At operation 2304, the workpress 106 is moved towards the socket 120 such that the pusher pins 118 extending from the workpress 106 engage and dynamically conform to the multi-planar topography of the chip package assembly 160. The workpress 106 is displaced towards the socket 120 a predefined distance so that the pusher pins 118 apply sufficient force to the chip package assembly 160 to ensure good electrical contact between the chip package assembly 160 and pads 124 of the socket 120. The good electrical contact enables robust and effective signal transmission between the chip package assembly 160 and the test controller 128.

At operation 2304, the pusher pins 118 extending from the workpress 106 may optionally engage one region of the chip package assembly 160 with a greater density of pins 118 than another region. At operation 2304, the pusher pins 118 extending from the workpress 106 may optionally engage one region of the chip package assembly 160 with pins 118 having a size that is different than pins 118 engaging another region of the chip package assembly 160. At operation 2304, one pusher pin 118 extending from the workpress 106 may optionally apply a greater force to one region of the chip package assembly 160 than the force applied by different pins 118 to another region of the chip package assembly 160. At operation 2304, one pusher pin 118 extending from the workpress 106 may optionally apply a greater force to one region of the chip package assembly 160 than the force applied by different pins 118 to another region of the chip package assembly 160, even though both pusher pins 118 are displaced substantially the same distance in one example, or are displaced substantially a different distance in a second example. At operation 2304, one pusher pin 118 extending from the workpress 106 may optionally apply a force to one region of the chip package assembly 160 that is substantially equal to the force applied by different pins 118 to another region of the chip package assembly 160, even though both pusher pins 118 are displaced substantially the same distance one example, or are displaced substantially a different distance in a second example.

At optional operation 2306, the test controller 128 communicates with at least one die, for example die 170, of the chip package assembly 160 though a conductive pusher pin 1018 disposed through the workpress 106. At optional operation 2308, one or more of the dice 168, 170 are cooled by conducting heat through a temperature control block 2100 disposed through the workpress 106.

At operation 2310, the chip package assembly 160, now connected to the controller 128 through the socket 120 and optionally one or more conductive pusher pins 1018 disposed through the workpress 106, is tested in accordance with a test routine executed by the test controller 128. As described above, the test may be one or more of a DC test routine, a burn-in routine, post burn-in routine, a final test routine or other predefined test routine to be performed on the chip package assembly 160.

Thus, a chip package assembly test system and method for testing a chip package assembly has been provided which improves testing by enabling testing of testing chip package assemblies with reduced probability to damage due to excessive force being applied to the chip package assembly by the workpress. In particular, the bottom surface of the workpress is configured to dynamically conform to the varied topography of the chip package assembly under test, thus more effectively controlling and distributing the force applied to the chip package assembly as compared to conventional test systems with metal workpresses. The use of non-conductive pusher pins and light loads allow force to be applied to regions of the chip package assembly that would be susceptive to damage and/or shorting in conventional test systems, thus providing a more robust and reliable test connections. Furthermore, the dynamically conforming bottom surface of the workpress enables a wider range of chip package assemblies to be tested utilizing the same workpress, thus improving the capacity (e.g., throughput) of the test system by minimizing down time for workpress exchange while reducing the cost of ownership.

While the foregoing is directed to embodiments of the present invention, other and further embodiments of the invention may be devised without departing from the basic scope thereof, and the scope thereof is determined by the claims that follow.

What is claimed is:

1. An integrated circuit chip package test system comprising:
    a socket configured to receive a chip package assembly for testing; and
    a workpress positioned over the socket, the workpress having a bottom that is dynamically conformable to a multi-planar top surface topography of the chip package assembly, wherein the workpress further comprises:
        a plurality of pusher pins, each pusher pin having a tip protruding through the bottom surface of the workpress, the tips of the plurality of pusher pins defining the bottom surface of the workpress.

2. The integrated circuit chip package test system of claim 1 comprising:
    an actuator coupled to the workpress, the actuator operable to automatically move the workpress towards and away from the socket.

3. The integrated circuit chip package test system of claim 1, wherein the plurality of pusher pins further comprises:
    at least one pusher pin that is electrically discontinuous tip to tip.

4. The integrated circuit chip package test system of claim 1, wherein the tip of at least one pusher pin of the plurality of pusher pins is fabricated from a dielectric material.

5. The integrated circuit chip package test system of claim 1 further comprising:
    a plurality of pusher pin holes each having one of the plurality of pusher pins disposed therein.

6. The integrated circuit chip package test system of claim 1 further comprising:
    a plurality of pusher pin holes, wherein at least one or more of the pusher pin holes defining a first group of pusher pin holes does not contain one of the plurality of pusher pins disposed therein, and wherein at least one or more of the pusher pin holes defining a second group of pusher pin holes having one of the plurality of pusher pins disposed therein.

7. The integrated circuit chip package test system of claim 1 further comprising:
    a plurality of pusher pin holes each having one of the plurality of pusher pins disposed therein; and
    a depleted area devoid of pusher pin holes defined within a boundary defined by an area of the bottom surfaced in which the plurality of pusher pin holes are form, the depleted area the size of at least one pusher pin hole.

8. The integrated circuit chip package test system of claim 1, wherein the plurality of pusher pins have a uniform pitch in at least one direction.

9. The integrated circuit chip package test system of claim 1, wherein the plurality of pusher pins further comprise:
    a first group of pusher pins having a first pitch in a first direction; and
    a second group of pusher pins having a second pitch in the first direction that is different than the first pitch.

10. The integrated circuit chip package test system of claim 1, wherein the plurality of pusher pins further comprise:
    a first group of pusher pins having a size; and
    a second group of pusher pins having a second size that is different than the first size.

11. The integrated circuit chip package test system of claim 1, wherein the plurality of pusher pins further comprise:
    a first pusher pin configured to generate a first force when the workpress engages the chip package assembly disposed in the socket; and
    a second pusher pin configured to generate a second force when the workpress engages the chip package assembly disposed in the socket, wherein the first force is different than the second force.

12. The integrated circuit chip package test system of claim 11, wherein pusher pin holes containing the first pusher pin and the second pusher pin have a common depth.

13. The integrated circuit chip package test system of claim 11, wherein at least one of the pusher pin holes has a spacer disposed therein.

14. The integrated circuit chip package test system of claim 11, wherein pusher pin holes containing the first pusher pin and the second pusher pin have a different depth.

15. The integrated circuit chip package test system of claim 1, wherein the plurality of pusher pins further comprise:
    a first pusher pin configured to generate a first force when the workpress engages the chip package assembly disposed in the socket; and
    a second pusher pin configured to generate a second force when the workpress engages the chip package assembly disposed in the socket, wherein the first force and the second force are substantially the same when holes containing the first and second pusher pins have different depths.

16. The integrated circuit chip package test system of claim 1 comprising:
    a temperature control block exposed through the bottom surface of the workpress.

17. The integrated circuit chip package test system of claim 1, wherein the plurality of pusher pins further comprises:
    a plurality of non-conductive pusher pins that are electrically discontinuous tip to tip; and
    at least one conductive pusher pin configured to permit high speed signal transmission therethrough.

18. A method for testing a chip package, the method comprising:
    moving a bottom surface of a workpress defined by a plurality of pusher pins against a multi-planar top surface topography of a chip package assembly disposed in a socket of an automated test system;
    dynamically conforming the bottom surface of the workpress to the multi-planar top surface topography of the chip package assembly as the workpress moves towards the socket; and
    testing the chip package utilizing signals transmitted through the socket to the chip package assembly.

19. The method of claim 18, wherein testing comprises:
    performing at least one of a DC test routine, a burn-in routine, post burn-in routine, or a final test routine.

* * * * *